(12) United States Patent
Noda

(10) Patent No.: US 9,484,072 B1
(45) Date of Patent: Nov. 1, 2016

(54) MIS TRANSISTORS CONFIGURED TO BE PLACED IN PROGRAMMED STATE AND ERASED STATE

(71) Applicant: NSCore, Inc., Fukuoka (JP)

(72) Inventor: Kenji Noda, Kanagawa (JP)

(73) Assignee: NSCore, Inc., Fukuoka (JP)

( * ) Notice: Subject to any disclaimer, the term of this patent is extended or adjusted under 35 U.S.C. 154(b) by 0 days.

(21) Appl. No.: 14/875,777

(22) Filed: Oct. 6, 2015

(51) Int. Cl.
G11C 11/34 (2006.01)
G11C 7/06 (2006.01)

(52) U.S. Cl.
CPC .................................. G11C 7/06 (2013.01)

(58) Field of Classification Search
USPC ............ 365/185.03, 185.08, 185.28, 185.29, 365/185.33
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,768,192 A | 6/1998 | Eitan | |
| 5,956,269 A | 9/1999 | Ouyang et al. | |
| 6,038,168 A | 3/2000 | Allen et al. | |
| 6,064,590 A | 5/2000 | Han et al. | |
| 6,335,554 B1 | 1/2002 | Yoshikawa | |
| 6,642,586 B2 | 11/2003 | Takahashi | |
| 6,740,927 B1 | 5/2004 | Jeng | |
| 6,903,968 B2 | 6/2005 | Jeng | |
| 6,906,953 B2 | 6/2005 | Forbes | |
| 6,906,962 B2 | 6/2005 | Layman et al. | |
| 6,909,635 B2 | 6/2005 | Forbes et al. | |
| 6,992,926 B2 | 1/2006 | Iwase et al. | |
| 7,082,057 B2 | 7/2006 | Shibata et al. | |
| 7,141,849 B2 | 11/2006 | Iwata et al. | |
| 7,151,706 B2 | 12/2006 | Nakamura | |
| 7,177,188 B2 | 2/2007 | Iwata et al. | |
| 7,187,588 B2 | 3/2007 | Iwata et al. | |
| 7,227,234 B2 | 6/2007 | Roizin et al. | |
| 7,238,984 B2 | 7/2007 | Shibata et al. | |
| 7,271,799 B2 | 9/2007 | Iwata et al. | |
| 7,301,198 B2 | 11/2007 | Iwata et al. | |
| 7,518,917 B2 * | 4/2009 | Noda .................... | G11C 11/412 365/185.08 |
| 7,544,993 B2 | 6/2009 | Iwata et al. | |
| 7,582,926 B2 | 9/2009 | Iwata et al. | |
| 7,598,559 B2 | 10/2009 | Iwata et al. | |
| 7,639,546 B2 * | 12/2009 | Kikuchi ............... | G11C 7/1006 365/185.08 |
| 8,451,657 B2 | 5/2013 | Horiuchi | |
| 2004/0232475 A1 | 11/2004 | Kataoka et al. | |
| 2004/0232477 A1 | 11/2004 | Iwata et al. | |
| 2004/0252554 A1 | 12/2004 | Fournel et al. | |
| 2006/0193174 A1 | 8/2006 | Choi et al. | |

FOREIGN PATENT DOCUMENTS

| | | |
|---|---|---|
| JP | H06-076582 | 3/1994 |
| JP | H06-231587 | 8/1994 |
| JP | 2001-156188 | 6/2001 |

(Continued)

*Primary Examiner* — Trong Phan
(74) *Attorney, Agent, or Firm* — IPUSA, PLLC

(57) ABSTRACT

A nonvolatile memory device includes a pair of MIS transistors one of which is placed in a programmed state by a first program operation utilizing a hot carrier effect to store one-bit data in the pair of MIS transistors, and a control unit configured to recall the one-bit data from the pair of MIS transistors in a recall operation, to cause an unprogrammed one of the MIS transistors to be placed in a programmed state by a second program operation utilizing a hot carrier effect in response to the one-bit data recalled from the pair of MIS transistors, and to erase the programmed states of both of the MIS transistors in an erase operation.

11 Claims, 16 Drawing Sheets

(56) References Cited

FOREIGN PATENT DOCUMENTS

| | | |
|---|---|---|
| JP | 2002-237540 | 8/2002 |
| WO | 2004/057621 | 7/2004 |
| WO | 2006/093629 | 9/2006 |

* cited by examiner

|  | EQ | RESTORE | WL | STORE | RECALL | ERASE |
|---|---|---|---|---|---|---|
| BUFFER WRITE | 1 | 1 | 0 | 1 | 1 | 0 |
| PROGRAM/ REVERSE-PROGRAM | 1 | 1 | VPP | 0 | 0 | 0 |
| RECALL | 0-1-1 | 0-0-1 | 0-1-0 | 1 | 1 | 0 |
| BUFFER READ | 1 | 1 | 0 | 1 | 1 | 0 |
| ERASE | 1 | 1 | VEE | 0 | 0 | 1 |
| STANDBY | 0 | 1 | 0 | 0 | 0 | 0 |

MIS TRANSISTORS CONFIGURED TO BE PLACED IN PROGRAMMED STATE AND ERASED STATE

BACKGROUND OF THE INVENTION

1. Field of the Invention

The disclosures herein generally relate to memory devices, and particularly relate to a nonvolatile memory device.

2. Description of the Related Art

Nonvolatile semiconductor memory devices include flash EEPROMs employing a floating gate structure, FeRAMs employing a ferroelectric film, MRAMs employing a ferromagnetic film, etc. EEPROMs typically require a transistor having a special structure comprised of a floating gate. FeRAMs and MRAMs, for example, achieve nonvolatile storage by use of a ferroelectric material and a ferromagnetic material, respectively, thereby requiring a film made of these respective materials. The need for such a transistor having a special structure and the need for such a film made of special material are one of the factors that result in an increase in the manufacturing costs.

A nonvolatile data storage function may alternatively be provided by utilizing an MIS (metal-insulating film-semiconductor) transistor as a memory cell transistor. That is, an MIS transistor having the same structure as ordinary MIS transistors that are typically used for conventional transistor functions (e.g., switching function) may be employed as a memory cell transistor. Such a memory cell transistor is advantageous because neither a special structure nor a special material is required.

PermSRAM, which utilizes an MIS transistor as a memory cell transistor, is commercially available. PermSRAM stores data in an MIS transistor by utilizing a hot-carrier effect. The hot-carrier effect refers to the injection of electrons into the insulating film (i.e., oxide film) and/or sidewalls of the transistor. The presence of electrons trapped in the insulating film and/or sidewalls causes a rise in the threshold voltage and a drop in the drain current. The amount of drain current of a given MIS transistor may be measured to determine whether this transistor has electrons trapped in the oxide film and/or sidewalls. The presence of trapped electrons may represent one-bit data "0", for example, and the absence of trapped electrons may represent one-bit data "1", for example.

The hot carrier effect is generally regarded as being substantially irreversible. Hot holes may be injected to the insulating film and/or sidewalls to remove some of the trapped electrons, thereby mitigating the effect of trapped electrons on the threshold voltage and the drain current. However, all the trapped electrons cannot be removed, and the remaining trapped electrons still causes a rise in the threshold voltage and a drop in the drain current.

SUMMARY OF THE INVENTION

A nonvolatile memory device includes a pair of MIS transistors one of which is placed in a programmed state by a first program operation utilizing a hot carrier effect to store one-bit data in the pair of MIS transistors, and a control unit configured to recall the one-bit data from the pair of MIS transistors in a recall operation, to cause an unprogrammed one of the MIS transistors to be placed in a programmed state by a second program operation utilizing a hot carrier effect in response to the one-bit data recalled from the pair of MIS transistors, and to erase the programmed states of both of the MIS transistors in an erase operation.

A method of controlling a nonvolatile memory device includes placing one of a pair of MIS transistors in a programmed state through a first program operation utilizing a hot carrier effect to store one-bit data in the pair of MIS transistors, recalling the one-bit data from the pair of MIS transistors in a recall operation, placing an unprogrammed one of the MIS transistors in a programmed state through a second program operation utilizing a hot carrier effect in response to the one-bit data recalled from the pair of MIS transistors, and erasing the programmed states of both of the MIS transistors in an erase operation.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings. In these drawings, the same or similar elements are referred to by the same or similar numerals, and a description thereof may be omitted as appropriate.

The disclosures herein are directed to PermSRAM. Namely, the memory cell transistors are MIS (metal-insulating film-semiconductor) transistors that have the same structure as ordinary MIS transistors used for conventional transistor functions (e.g., switching function). These memory cell transistors use neither a special structure, such as a floating gate, nor a special material, such as a ferroelectric material or a ferromagnetic material. These MIS transistors are configured to selectively experience a hot-carrier effect on purpose for storage of data. The hot-carrier effect leaves a lingering change in the transistor characteristics to the MIS transistors. A change in the transistor characteristics caused by the hot-carrier effect achieves nonvolatile data retention.

In the following description, NMOS transistors are used as an example of the nonvolatile-memory-cell MIS transistors, but such examples are not intended to be limiting. PMOS transistors may alternatively be used as nonvolatile-memory-cell transistors.

Further, an operation to cause electrons to be trapped in the sidewalls and/or insulating film of a memory-cell MIS transistor is referred to as a program operation. An operation to read data stored in a memory-cell MIS transistor is referred to as a recall operation. An operation to erase data stored in a memory-cell MIS transistor is referred to as an erase operation.

Figure 1:
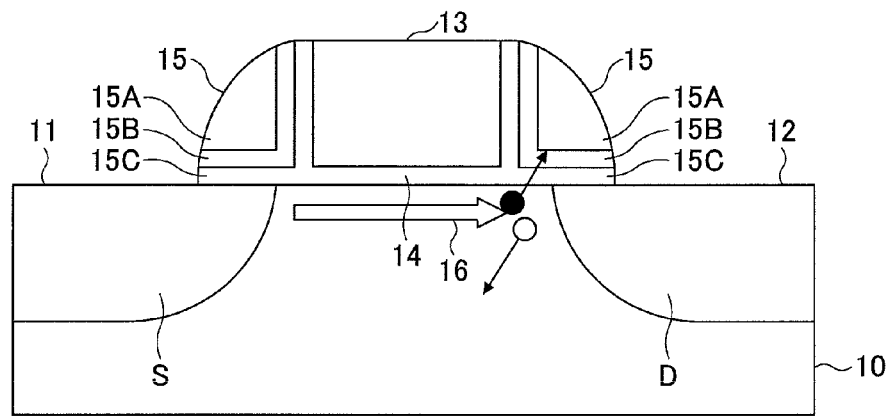
FIG. 1 is a cross-sectional view of an NMOS transistor serving as a memory cell transistor.

FIG. 1 is a cross-sectional view of an NMOS transistor serving as a memory cell transistor. An N-type diffusion region 11 and an N-type diffusion region 12 are formed in a P-type substrate 10 to serve as the source S and drain D of a transistor, respectively. A gate electrode 13 is formed on the P-type substrate 10 at the position of the channel between the source S and the drain D, with an insulating film 14 (e.g., oxide film) intervening between the gate electrode 13 and the P-type substrate 10. Sidewalls 15 are disposed on the lateral faces of the gate electrode 13.

Each of the sidewalls 15 may have a monolithic structure made of such a material as silicon dioxide, for example. Alternatively, as illustrated in FIG. 1, each of the sidewalls 15 may have a multilayer structure comprised of at least three films of at least two different semiconductor materials. The multiplayer structure may include a silicon dioxide film 15A, a silicon nitride film 15B, and a silicon dioxide film 15C. Such a three-layer structure shown in FIG. 1 creates potential barriers having a dip in the middle with respect to electrons. Accordingly, the sidewalls 15 shown in FIG. 1 can easily trap a large amount of electrons in a short time, and can keep the electrons trapped therein for a long time.

For the purpose of causing the trapping of electrons in FIG. 1, the source node C (i.e., the N-type diffusion region 11) may be set to 0 V, and the drain node D (i.e., the N-type diffusion region 12) may be set to 5 V, with the gate electrode 13 being set to 5 V. The drain node D may be set to as high voltage as possible in order to achieve an efficient program operation as long as the voltage does not exceed the tolerance range of the transistor. It suffices for the gate electrode 13 to be set to a voltage higher than the threshold voltage of the transistor, but the efficiency of data programming increases as the voltage approaches the drain voltage.

With these voltage settings, hot electrons having high-kinetic energy flowing through the transistor channel from the source S to the drain D as illustrated by an arrow 16 causes impact ionization to occur at the channel/drain junction to create electron-hole pairs. In FIG. 1, an electron and a hole are illustratively shown by an open circle and a solid circle, respectively. Because this impact ionization occurs directly under the sidewall 15 on the drain side, hot electrons generated by the impact ionization are easily injected into the sidewall 15. This injection achieves a large, sustainable change in the transistor characteristics. In this manner, the NMOS transistor illustrated in FIG. 1 is programmed (i.e., placed in a programmed state) by a hot carrier effect.

Figure 2:
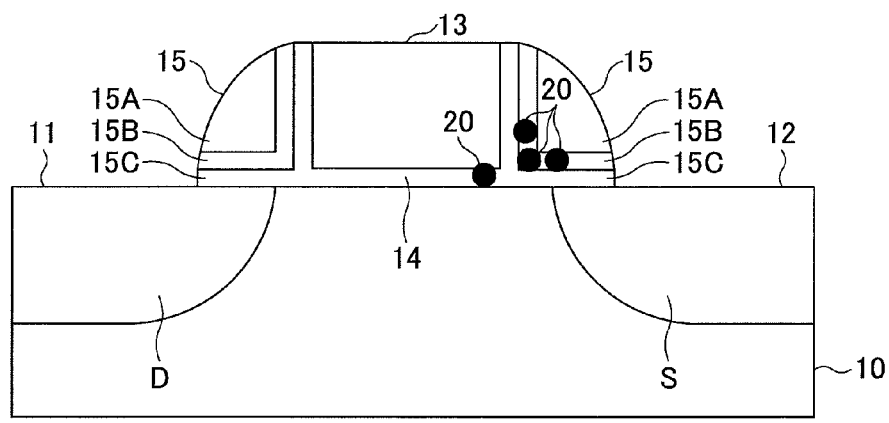
FIG. 2 is a cross-sectional view of the NMOS transistor having undergone a program operation.

FIG. 2 is a cross-sectional view of the NMOS transistor having undergone a program operation. In FIG. 2, electrons 20 are trapped in the insulating film 14 and in one of the sidewalls 15. In the case of a recall operation being performed, the N-type diffusion region 11 may be set to 1.2 V, and the N-type diffusion region 12 may be set to 0 V, with the gate electrode 13 being set to 1.2 V. Namely, the N-type diffusion region 11 and the N-type diffusion region 12 are employed as a drain node D and a source node S, respectively.

It should be noted that when a program operation is performed as illustrated in FIG. 1, the N-type diffusion region 11 and the N-type diffusion region 12 are employed as a source node S and a drain node D, respectively. This program operation results in electrons being trapped in the sidewall 15 situated on the same side as the drain. At the time of performing a recall operation, the source/drain roles of the N-type diffusion regions 11 and 12 are swapped relative to those of the program operation, and the N-type diffusion region 11 and the N-type diffusion region 12 are employed as a drain node D an a source node S, respectively.

The hot-carrier effect is asymmetric with respect to the source and drain relation of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately an order of magnitude.

The amount of drain current of the MIS transistor may be measured with the above-noted voltage settings to determine whether this transistor has electrons trapped in the insulating film 14 and in the sidewall 15 on the source side. The amount of drain current is significantly lower with the presence of trapped electrons than the amount of drain current that would be observed without the presence of trapped electrons.

Figure 3:
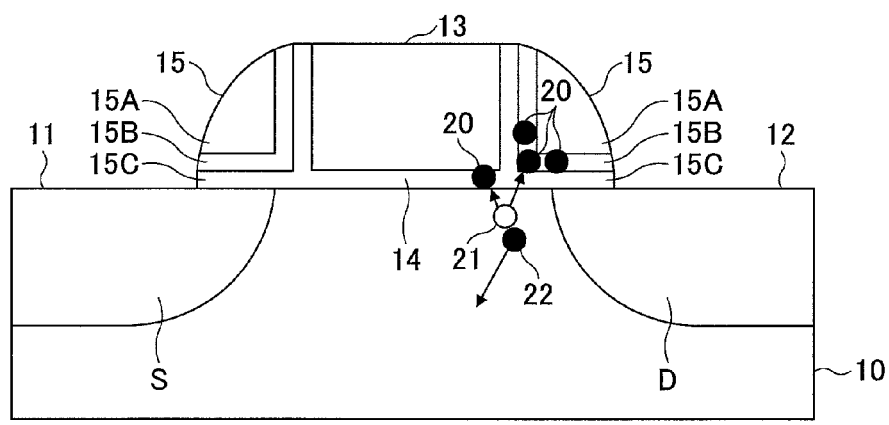
FIG. 3 is a cross-sectional view of the NMOS transistor illustrated for the purpose of explaining an erase operation.

FIG. 3 is a cross-sectional view of the NMOS transistor illustrated for the purpose of explaining an erase operation. In the case of an erase operation being performed, the N-type diffusion region 11 may be set to 0 V, and the N-type diffusion region 12 may be set to 5 V, with the gate electrode 13 being set to −5 V. The N-type diffusion region 11 and the N-type diffusion region 12 are employed as a drain node S and a source node D, respectively, in the same manner as in the case of a program operation.

The drain node D may be set to as high a voltage as possible within the tolerance range of the transistor in order to achieve an efficient erase operation. It suffices for the gate electrode 13 to be set to as low voltage as possible within the tolerance range of the transistor in order to achieve an efficient erase operation.

With these voltage settings, hot electrons having high-kinetic energy flowing through the transistor channel from the source S to the drain D causes impact ionization to occur at the channel/drain junction to create electron-hole pairs. In FIG. 3, a hole 21 and an electron 22 are illustrated as an electron-hole pair. Because this impact ionization occurs directly under the sidewall 15 on the drain side, hot holes generated by the impact ionization are easily injected into the sidewall 15. This injection serves to remove some of the trapped electrons 20 to mitigate the change of transistor characteristics caused by the previously performed program operation. Namely, the programmed state of the NMOS transistor may be erased by the injection of hot holes. However, all the trapped electrons 20 cannot be removed, and the remaining trapped electrons 20 still causes a rise in the threshold voltage and a drop in the drain current.

Figure 4:
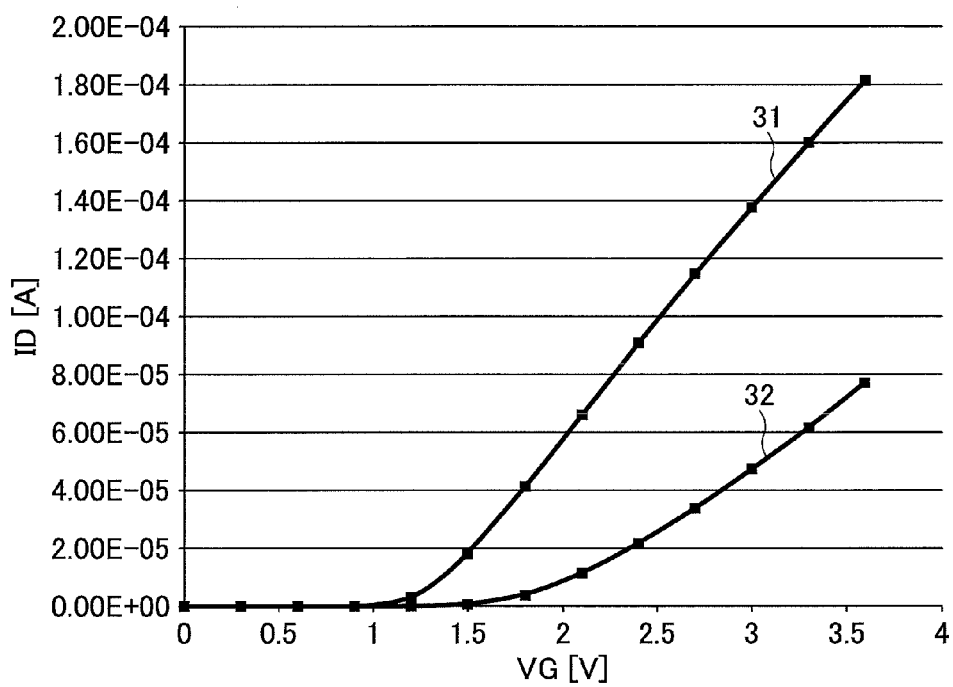
FIG. 4 is a diagram illustrating an example of the voltage-current characteristics of an MIS transistor.

FIG. 4 is a diagram illustrating an example of the voltage-current characteristics of an MIS transistor. In FIG. 4, the horizontal axis represents the gate voltage (VG) as measured in voltage, and the vertical axis represents the drain current (ID) as measured in ampere. In FIG. 4 and subsequent similar drawings (i.e., FIGS. 5-7), the notation "AE-B" illustrated beside the vertical axis represents $A \times 10^{-B}$. For example, 1.60E-04 represents $1.6 \times 10^{-4}$. The notation "0.00E+00" represents 0. In FIG. 4, a characteristic curve 31 represents the amount of drain current as observed with respect to a range of gate voltages before the MIS transistor is subjected to a program operation. A characteristic curve 32 represents the amount of drain current as observed with respect to a range of gate voltages after the MIS transistor having the voltage-current characteristics of the characteristics curve 31 is subjected to one program operation.

Figure 5:
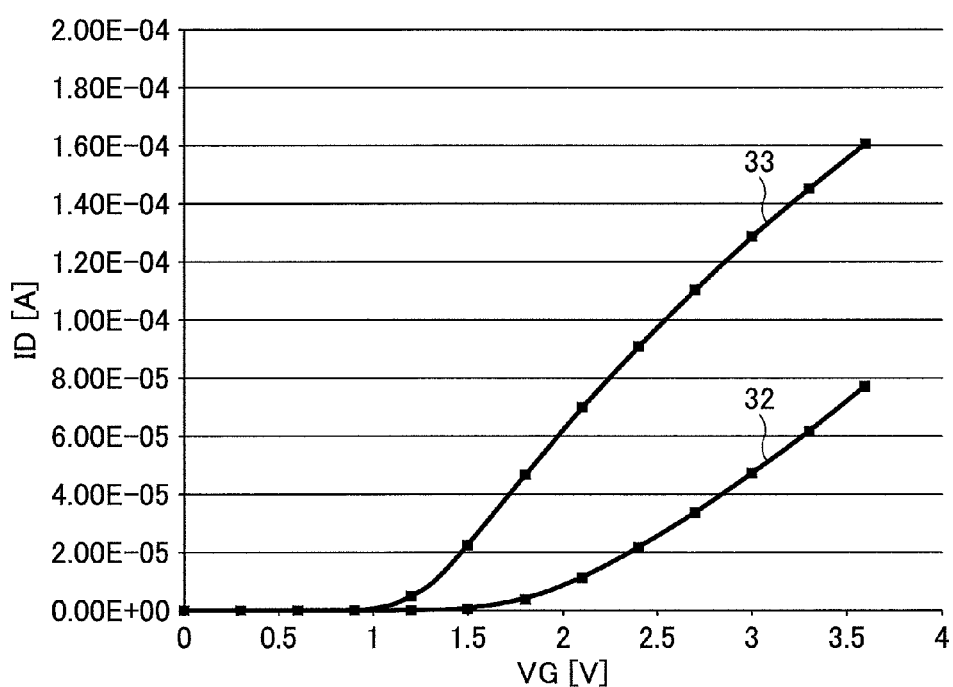
FIG. 5 is a diagram illustrating an example of the voltage-current characteristics of an MIS transistor.

FIG. 5 is a diagram illustrating an example of the voltage-current characteristics of an MIS transistor. The horizontal and vertical axes are the same as those of FIG. 4. The characteristic curve 32 is the same as the characteristics curve 32 illustrated in FIG. 4. A characteristic curve 33 represents the amount of drain current as observed with respect to a range of gate voltages after the MIS transistor having the voltage-current characteristics of the characteristics curve 32 is subjected to one erase operation.

As can be seen from comparison between the characteristic curve 31 illustrated in FIG. 4 and the characteristic curve 33 illustrated in FIG. 5, the amount of drain current of an MIS transistor decreases after the MIS transistor is subjected to one program-&-erase cycle comprised of one program operation and one erase operation. Namely, the erase operation cannot bring the characteristics of the MIS transistor back to the original characteristics that were in existence before the program operation. Some of the effect of the program operation lingers even after the erase operation is performed.

Figure 6:
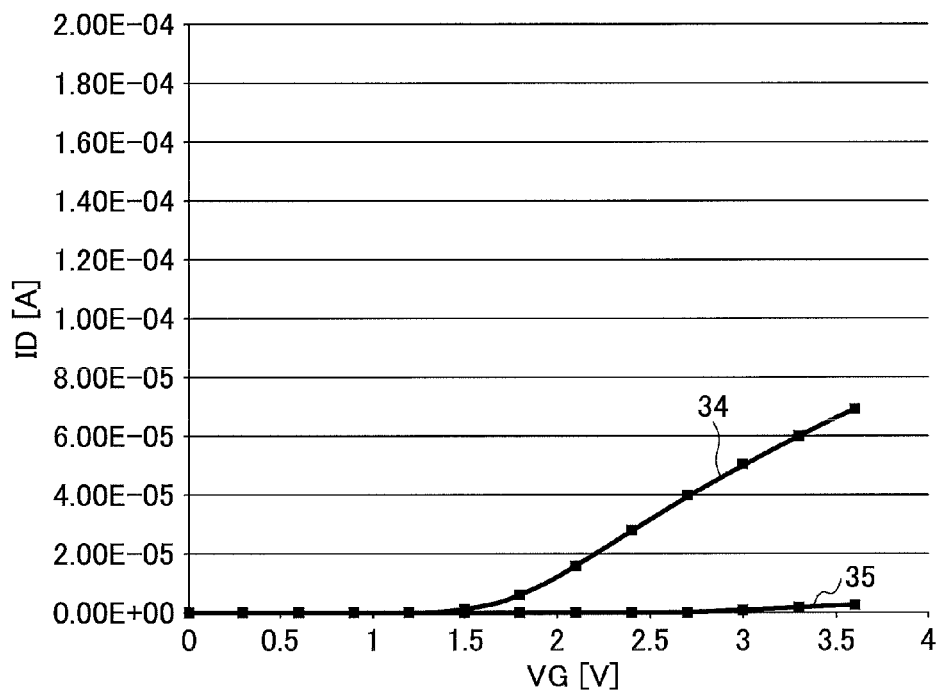
FIG. 6 is a diagram illustrating an example of the voltage-current characteristics of an MIS transistor after the program-&-erase cycle is performed one thousand times.

FIG. 6 is a diagram illustrating an example of the voltage-current characteristics of an MIS transistor after the program-&-erase cycle is performed one thousand times. The horizontal and vertical axes are the same as those of FIG. 4. A characteristic curve 34 represents the amount of drain current as observed with respect to a range of gate voltages after an MIS transistor is subjected to the program-&-erase cycle one thousand times. A characteristic curve 35 represents the amount of drain current as observed with respect to a range of gate voltages after the MIS transistor having the voltage-current characteristics of the characteristics curve 34 is subjected to one program operation.

Figure 7:
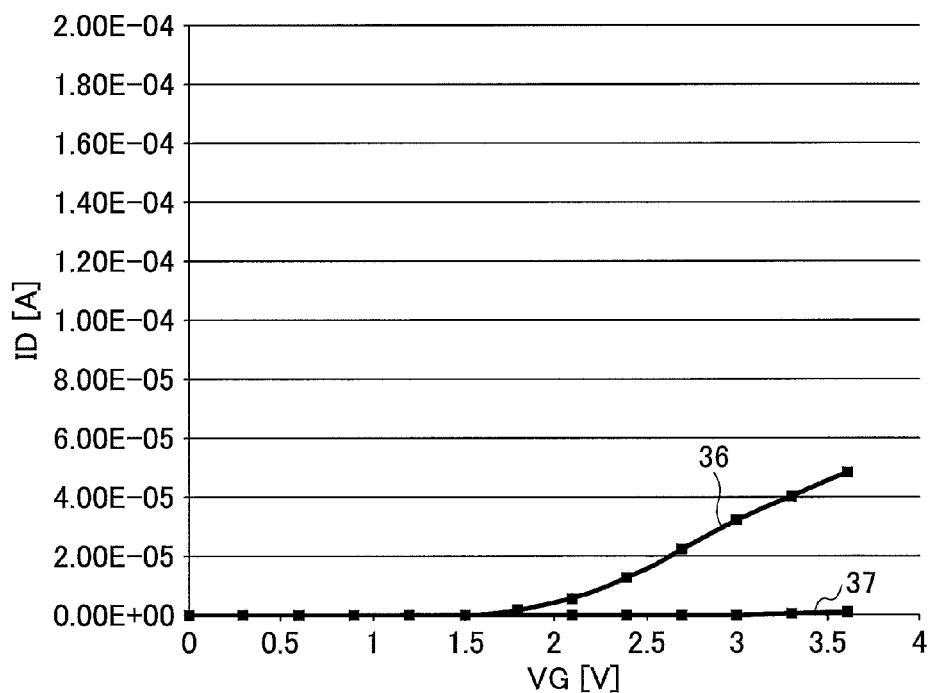
FIG. 7 is a diagram illustrating an example of the voltage-current characteristics of an MIS transistor after the program-&-erase cycle is performed ten thousand times.

FIG. 7 is a diagram illustrating an example of the voltage-current characteristics of an MIS transistor after the program-&-erase cycle is performed ten thousand times. The horizontal and vertical axes are the same as those of FIG. 4. A characteristic curve 36 represents the amount of drain current as observed with respect to a range of gate voltages after an MIS transistor is subjected to the program-&-erase cycle ten thousand times. A characteristic curve 37 represents the amount of drain current as observed with respect to a range of gate voltages after the MIS transistor having the voltage-current characteristics of the characteristics curve 36 is subjected to one program operation.

As can be seen from the characteristics curves 34 through 37, the amount of drain current of an MIS transistor decreases as the number of program-&-erase cycles increases. A typical data detection mechanism in a memory device utilizes a sense amplifier that compares the drain current of a memory-cell transistor with a reference current for the purpose of detecting data stored in the memory-cell transistor. Since the amount of drain current of an MIS transistor changes with the number of program and erase operations, a constant reference current is not usable when MIS transistors are utilized as nonvolatile memory-cell transistors that are programmable and erasable multiple times.

Figure 8:
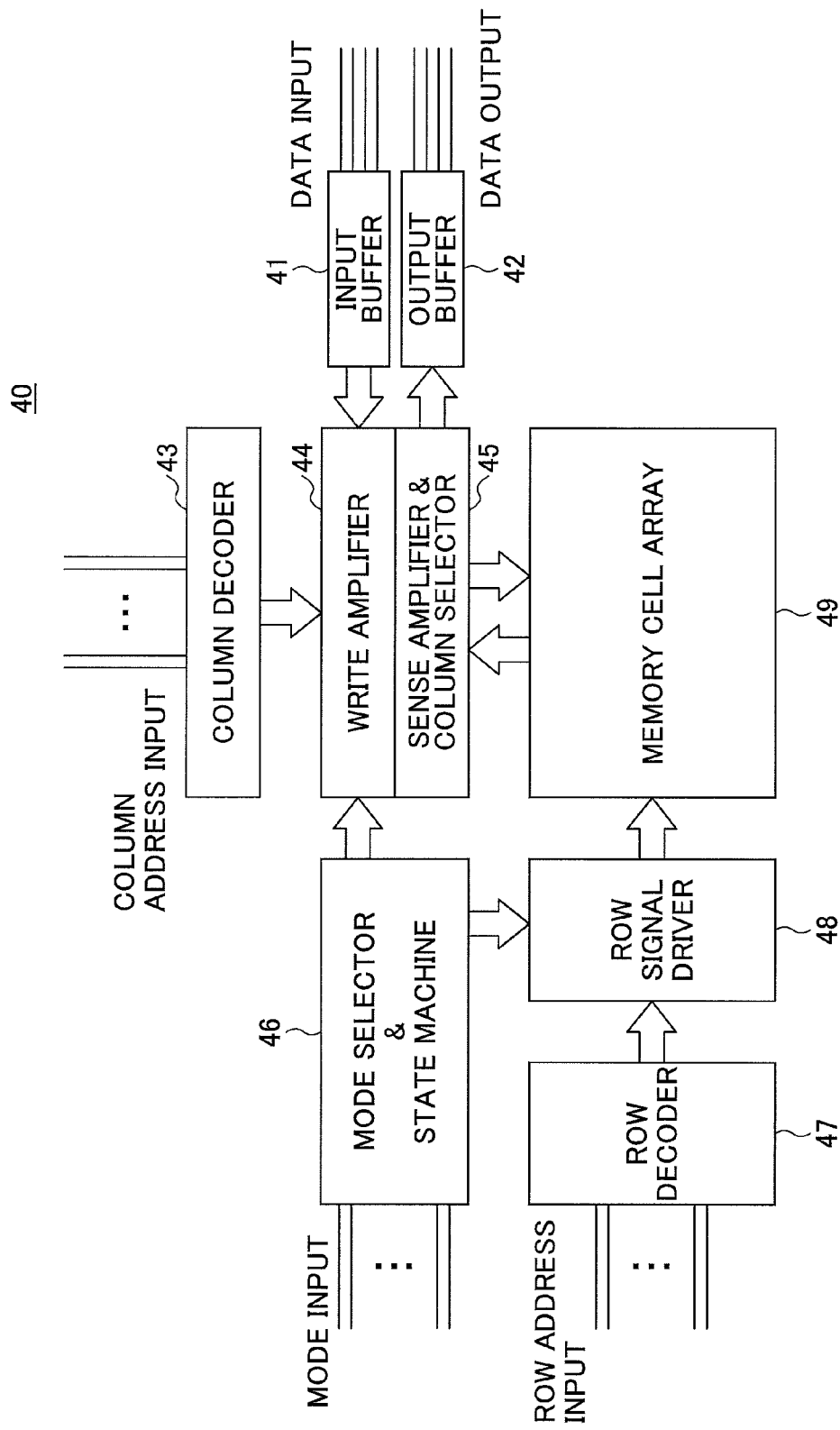
FIG. 8 is a block diagram illustrating an example of the configuration of a nonvolatile semiconductor memory device according to an embodiment.

FIG. 8 is a block diagram illustrating an example of the configuration of a nonvolatile semiconductor memory device according to an embodiment. A semiconductor memory device 40 illustrated in FIG. 8 includes an input buffer 41, an output buffer 42, a column decoder 43, a write amplifier 44, a sense amplifier & column selector 45, a mode selector & state machine 46, a row decoder 47, a row signal driver 48, and a memory cell array 49.

The memory cell array 49 includes a plurality of memory cells arranged in a matrix form. The memory cells arranged in the same column are connected to the same bit lines, and the memory cells arranged in the same row are connected to the same word line.

The mode selector & state machine 46 receives mode input signals from outside the semiconductor memory device 40, and decodes the mode input signals to determine an operation mode (e.g., a program operation mode, a recall operation mode, or an erase operation mode). Control signals responsive to the determined operation mode are supplied to the write amplifier 44, the sense amplifier & column selector 45, the row signal driver 48, etc., for control of the individual parts of the semiconductor memory device 40.

The column decoder 43 receives a column address input from outside the semiconductor memory device 40, and decodes the column address input to determine a selected column. The decode signals indicative of the selected column are supplied to the write amplifier 44 and the sense amplifier & column selector 45.

The row decoder 47 receives a row address input from outside the semiconductor memory device 40, and decodes the row address input to determine a selected row. The decode signals indicative of the selected row are supplied to the row signal driver 48.

In response to the control signals from the mode selector & state machine 46 and the decode signals from the row decoder 47, the row signal driver 48 activates a selected word line among the word lines extending from the row signal driver 48. As a result of the activation of the selected word line, a program, recall or erase operation is performed with respect to one or more memory cells coupled to the activated word line.

In response to the control signals from the mode selector & state machine 46 and the decode signals from the column decoder 43, the column selector of the sense amplifier & column selector 45 couples bit lines corresponding to one or more selected columns to a data bus, which is connected to the input buffer 41 through the write amplifier 44 and also connected to the output buffer 42. Through this coupling, data is transferred between the memory cell array 49 and the input buffer 41 or between the memory cell array 49 and the output buffer 42. In a recall operation, the sense amplifiers of the sense amplifier & column selector 45 sense (i.e., detect) data of the memory cells connected to the activated word line in the memory cell array 49. The sensed data may be supplied to the output buffer 42 for provision to outside the semiconductor memory device 40 as output data. Input data supplied to the input buffer 41 is provided to the write amplifier 44. The write amplifier 44 amplifies the input data to be written to the memory cell array 49.

Figure 9:
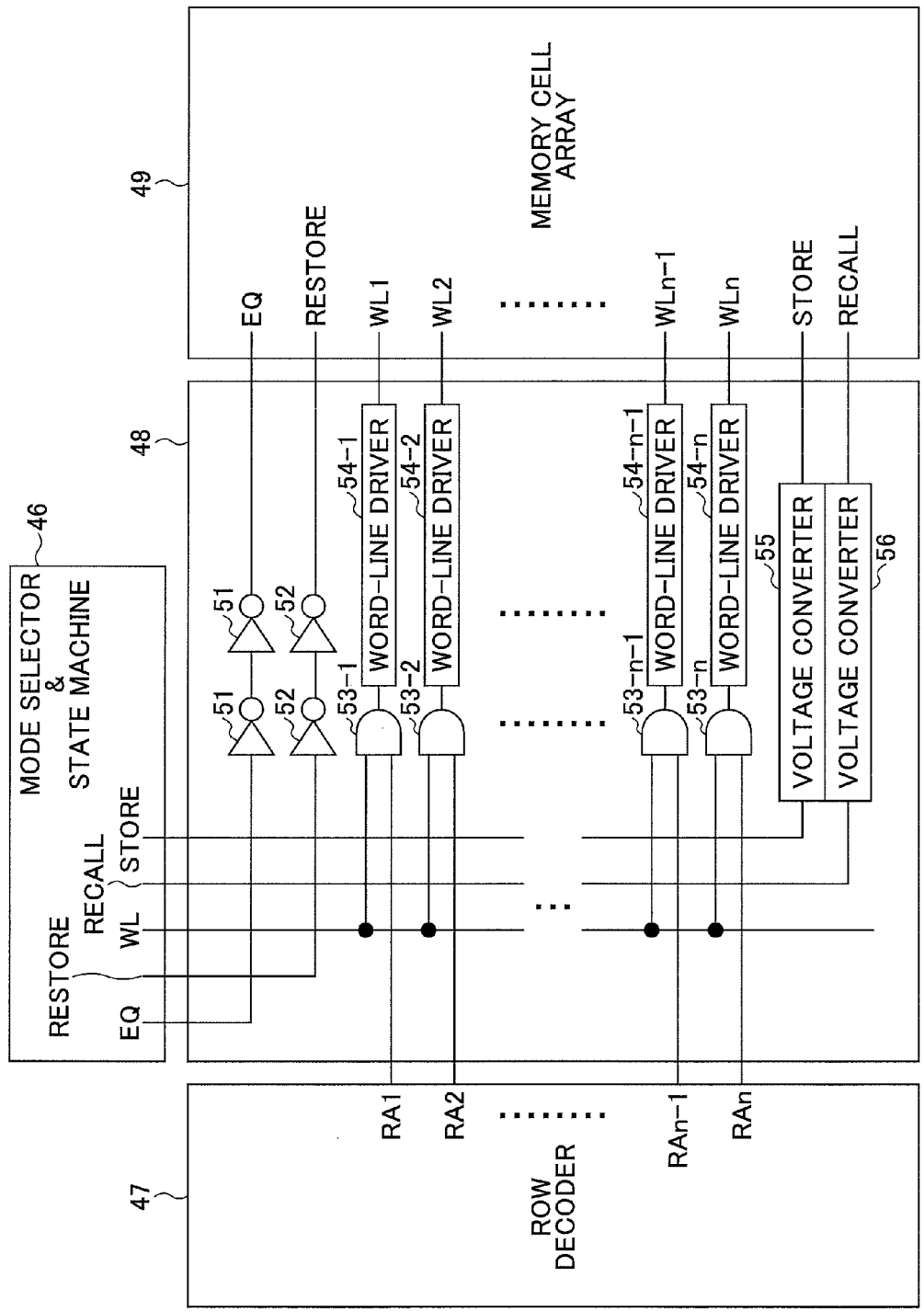
FIG. 9 is a drawing illustrating examples of signal lines extending from a row signal driver and their relations with a mode selector & state machine and a row decoder.

FIG. 9 is a drawing illustrating examples of signal lines extending from the row signal driver 48 and their relations with the mode selector & state machine 46 and the row decoder 47. The mode selector & state machine 46 supplies signals EQ, RESTORE, WL, RECALL and STORE (i.e., control signals) to the row signal driver 48. The signals EQ, RESTORE, STORE and RECALL are coupled to the corresponding lines extending in the memory cell array 49, respectively, without any change in their logical values. The signals EQ, RESTORE, STORE and RECALL are output from the row signal driver 48 to the memory cell array 49 as EQ, RESTORE, STORE and RECALL, respectively. Inverters 51 and 52 are used as signal drivers to drive the signals EQ and RESTORE, respectively, with sufficient drive powers. Voltage converters 55 and 56 convert the voltage levels of the signals STORE and RECALL, respectively, to appropriate voltage levels.

The signal WL supplied from the mode selector & state machine 46 and one of the row address signals RA1, RA2, . . . and RAn are combined by a corresponding one of the NAND gates 53-1 through 53-n. In response to the outputs of the NAND gates 53-1 through 53-n, word-line drivers 54-1 through 54-n drive word lines WL1 through WLn, respectively, extending in the memory cell array 49. With this arrangement, only one of the word lines WL1 through WLn is activated in the memory cell array 49 so as to activate a selected row address.

Figure 10:
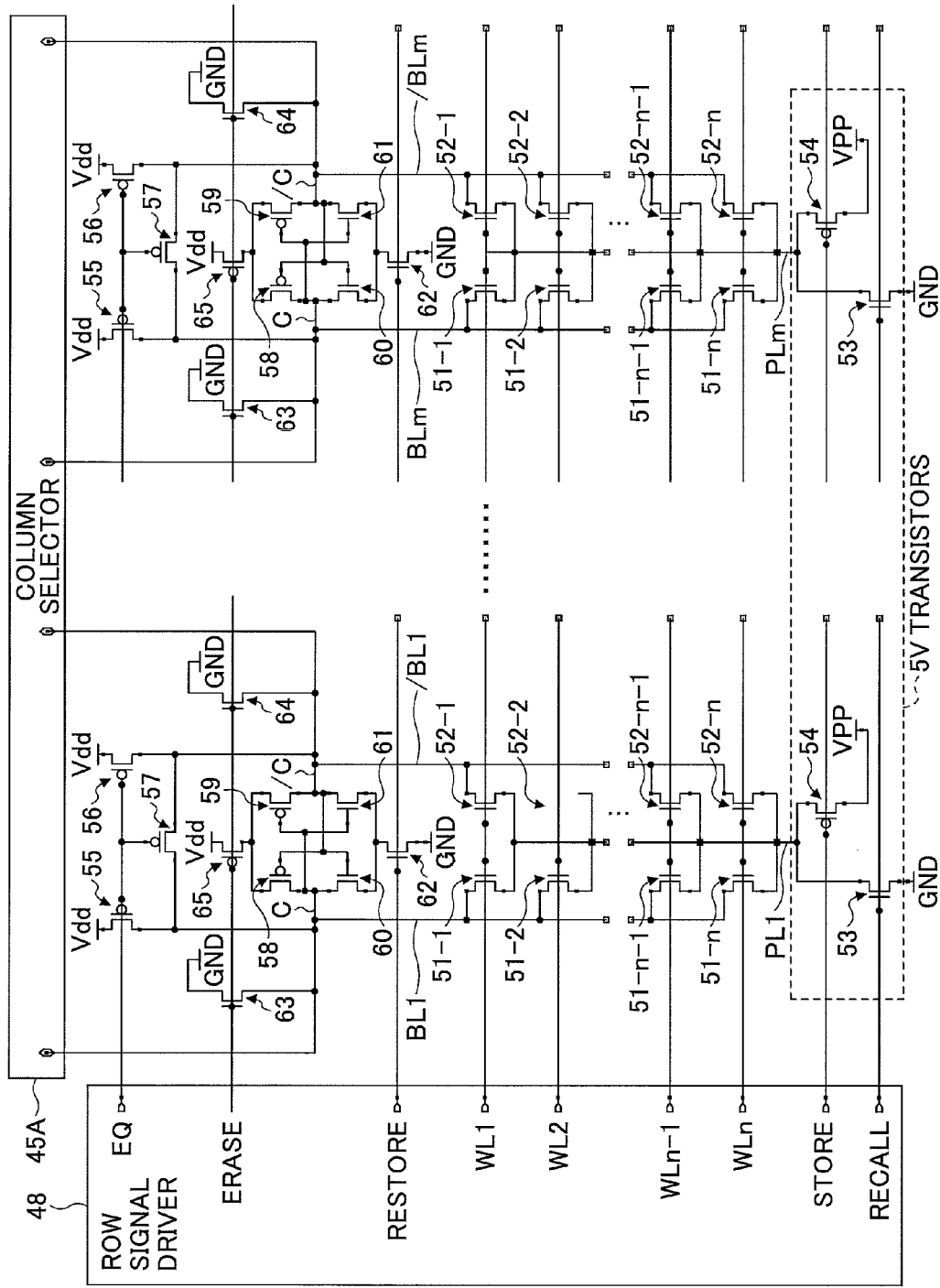
FIG. 10 is a drawing illustrating an example of the configuration of a memory cell array and the sense amplifiers of a sense amplifier & column selector.

FIG. 10 is a drawing illustrating an example of the configuration of the memory cell array 49 and the sense amplifiers of the sense amplifier & column selector 45 according to the present embodiment. In FIG. 10, the memory cell array 49 includes n word lines WL1 through WLn, and m bit-line pairs BL1 and /BL1 through BLm and /BLm. A memory cell is situated at the intersection between a given word line WLi (i=1, 2, . . . , or n) and a given bit-line pair, and includes a pair of NMOS transistors 51-$i$ and 52-$i$. In FIG. 10, each transistor is given the same reference numeral across all the bit-line pairs for the sake of convenience. A given word line WLi is connected to the gate nodes of all the NMOS transistors 51-$i$ and 52-$i$ that are aligned on the same row.

The first column corresponding to the bit-line pair BL1 and /BL1 through the m-th column corresponding to the bit-line pair BLm and /BLm include potential lines PL1 through PLm, respectively. At the first column corresponding to the bit-line pair BL1 and /BL1, for example, the NMOS transistor 51-$i$ has one end of the channel thereof connected to the bit-line BL1, and has the other end of the channel thereof connected to the potential line PL1. Further, the NMOS transistor 52-$i$ has one end of the channel thereof connected to the bit-line /BL1, and has the other end of the channel thereof connected to the potential line PL1.

Each of the potential lines PL1 through PLm is coupled to a ground voltage Gnd (e.g., 0 V) through an NMOS transistor 53, and is also coupled to an extra-high voltage VPP (e.g., 5 V) through a PMOS transistor 54. The NMOS transistor 53 has the gate node thereof connected to the signal RECALL. The PMOS transistor 54 has the gate node thereof connected to the signal STORE. The NMOS transistor 53 and the PMOS transistor 54 may be high-voltage transistors that are capable of operating with high voltage (e.g., 5 V). Other transistors may be designed to operate with normal power supply voltage (e.g., 3.3 V).

PMOS transistors 55 through 57 are provided for the purpose of equalizing the bit-line pairs. The PMOS transistors 55 through 57 have the ground nodes thereof connected to the signal EQ, which is supplied from the row signal driver 48. When the signal EQ is set to LOW, the two bit lines of each bit-line pair are set to a high voltage Vdd (e.g., 3.3 V), and are electrically coupled to each other through the PMOS transistor 57 to ensure that the two bit lines are set to the equal potential.

At each column, PMOS transistors 58 and 59 and NMOS transistors 60 and 61 together constitute a sense amplifier. The sense amplifier at a given column serves to sense the data read from the memory cell of an activated word line by amplifying a difference in voltages between the two bit lines of the given column. The sense amplifiers of the first through m-th columns belong to the sense amplifier & column selector 45. The remaining portion of the sense amplifier & column selector 45 other than these sense amplifiers is illustrated as a column selector 45A in FIG. 10. Two nodes C and /C of each sense amplifier that are connected to the two respective bit lines are connected to the column selector 45A.

An NMOS transistor 63 has a source node thereof connected to the ground voltage Gnd and a drain node thereof connected to the node C. An NMOS transistor 64 has a source node thereof connected to the ground voltage Gnd and a drain node thereof connected to the node /C. A PMOS transistor 65 has a source node thereof connected to the power supply voltage Vdd and a drain node thereof connected to the source nodes of the PMOS transistors 58 and 59. The NMOS transistors 63 and 64 and the PMOS transistor 65 have gate nodes thereof receiving a control signal ERASE supplied from the mode selector & state machine 46. The control signal ERASE may be generated in response to one or more mode input signals that are supplied to the mode selector & state machine 46 to specify an erase operation. The high-voltage state of the control signal ERASE causes both of the nodes C and /C to be coupled to the ground voltage Gnd.

Figures 11, 12:
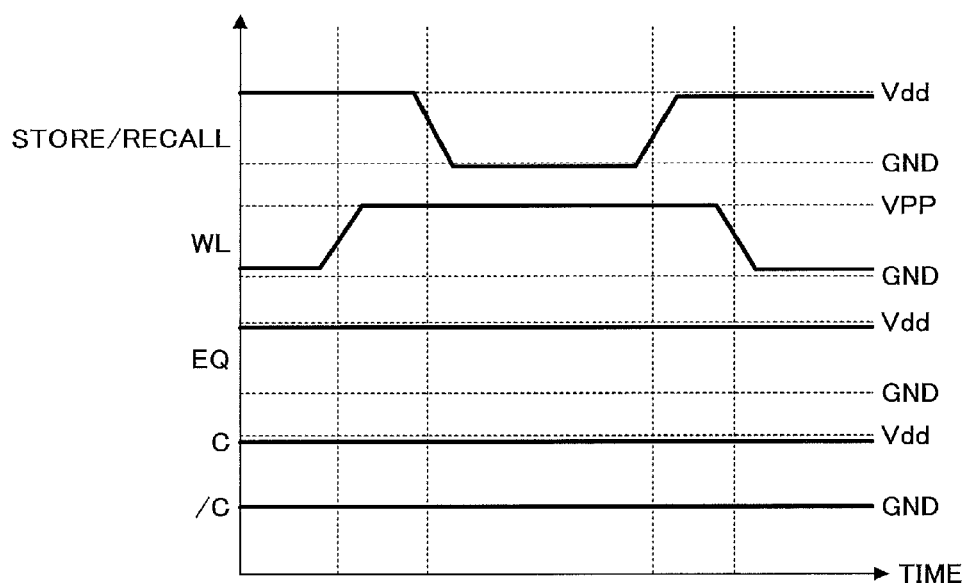
FIG. 11 is a table chart illustrating examples of the signal levels of control signals that are defined with respect to each operation.
FIG. 12 is a signal waveform diagram illustrating an example of a program operation.

FIG. 11 is a table chart illustrating examples of the signal levels of the control signals that are defined with respect to each operation. The columns of the table correspond to the respective control signals EQ, RESTORE, WL, STORE, RECALL and ERASE, which are generated by the mode selector & state machine 46 in response to the mode input signals supplied from outside the semiconductor memory device 40. The rows of the table correspond to respective operations "BUFFER WRITE", "PROGRAM/REVERSE-PROGRAM", "RECALL", "BUFFER READ", "ERASE" and "STANDBY". In FIG. 11, the notation "0-1-0", for example, indicates that the signal level is set to "0" at the first phase, "1" at the second phase, and "0" at the third phase. The notations "0-1-1" and "0-0-1" indicate changing signal levels in a similar manner.

"BUFFER WRITE" refers to the operation that writes data to a sense amplifier. Namely, data input into the input buffer 41 of the semiconductor memory device 40 is amplified by the write amplifier 44, and is then applied to one or more sense amplifiers of one or more selected columns. With the signal RESTORE being set to HIGH (i.e., "1"), the NMOS transistor 62 of a sense amplifier of interest is placed in the conductive state, so that the sense amplifier stores the data supplied thereto.

"BUFFER READ" refers to the operation that reads data from the sense amplifier. With the signal RESTORE being set to HIGH (i.e., "1"), the NMOS transistor 62 of a sense amplifier of interest is placed in the conductive state, so that the sense amplifier maintains the data stored therein, which is then supplied to the output buffer 42 through the sense amplifier & column selector 45.

"STANDBY" refers to the state in which data is maintained in the sense amplifier. With the signal RESTORE being set to HIGH (i.e., "1"), the NMOS transistor 62 of a sense amplifier of interest is placed in the conductive state, so that the sense amplifier maintains the data stored therein.

"PROGRAM/REVERSE-PROGRAM" refers to the program operation that programs the NMOS transistors of a memory cell according to the data stored (i.e., written) in the sense amplifier. "RECALL" refers to the recall operation that reads data from a memory cell to the sense amplifier. "ERASE" refers to the erase operation that erases the NMOS transistors of a memory cell. These three operations will be described later in detail.

The mode selector & state machine 46 sets the control signals to signal levels (signal states) as illustrated in the table of FIG. 11 in response to the mode input signals. Through such settings of the control signals, the mode selector & state machine 46 controls the write amplifier 44 and the row signal driver 48 to perform a requested operation with respect to the memory cell array 49.

FIG. 12 is a signal waveform diagram illustrating an example of the program operation. When a program operation is performed in order to store write data supplied from outside the semiconductor memory device 40, this program operation is referred to simply as the "PROGRAM" operation. When a program operation is performed immediately after the recall operation in order to provide a balance between the two NMOS transistors of a memory cell as will be described later, this program operation is referred to as the "REVERSE-PROGRAM" operation.

When the mode input from outside the semiconductor memory device 40 indicates the program operation, the control signals EQ, RESTORE, WL, STORE and RECALL are set to 1, 1, 1 (i.e. extra-high voltage VPP), 0 and 0, respectively, as shown in FIG. 11. FIG. 12 illustrates the waveforms of the signals STORE, RECALL, WL (i.e., selected word line), EQ, C and /C (i.e., the two nodes of the sense amplifier). A selected word line WLi in FIG. 10 (shown as WL in FIG. 12) is set to the extra-high voltage VPP. In response to STORE being 0 (i.e., LOW), the PMOS transistor 54 in FIG. 10 is placed in the conductive state, so that the extra-high voltage VPP is applied to the drain nodes of the NMOS transistors 51-$i$ and 52-$i$ connected to the activated word line WLi. In the example illustrated in FIG. 12, the nodes C and /C of the sense amplifier are HIGH and LOW, respectively. Accordingly, one of the NMOS transistors 51-$i$ and 52-$i$ whose source node is connected to the LOW node /C is programmed by the program operation.

Figure 13:
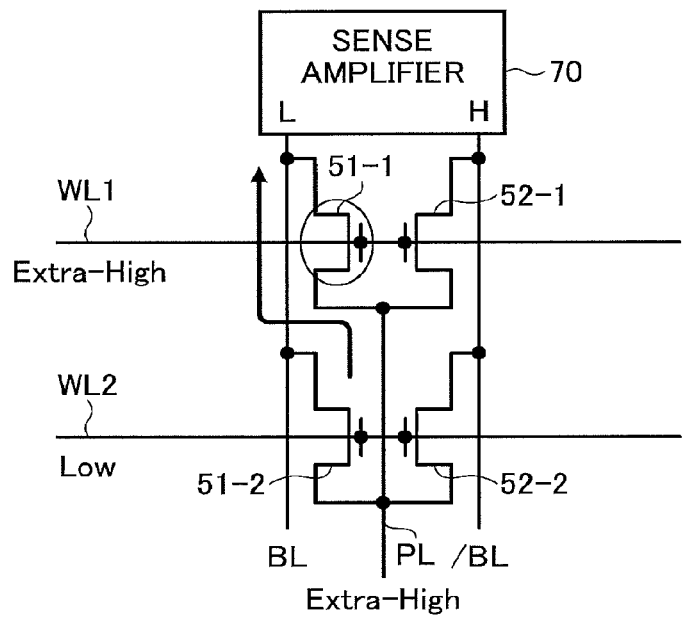
FIG. 13 is a drawing illustrating an example of the operation of a memory cell and a sense amplifier at the time of a program operation.

FIG. 13 is a drawing illustrating an example of the operation of a memory cell and a sense amplifier at the time of a program operation. In FIG. 13, the word line WL1 is selectively activated to the extra-high voltage, and the word line WL2 is low. This word-line setting selects the memory cell connected to the word line WL1 for the program operation. In the example illustrated in FIG. 13, a sense amplifier 70 has data stored therein such that the two nodes thereof connected to bit lines BL and /BL are LOW and HIGH, respectively. A potential line PL is set to an extra-high voltage such as 5 V, for example. As a result, the NMOS transistor 51-1 that is connected to the LOW node of the sense amplifier 70 is programmed to have electrons trapped in the insulating film and sidewall. The NMOS transistor 52-1 that is connected to the HIGH node of the sense amplifier 70 is not programmed. The programmed NMOS transistor 51-1 is indicated by an open oval mark superimposed thereon in FIG. 13. It may be noted that in FIG. 13 and subsequent similar drawings (i.e., FIG. 15, FIG. 16 and FIGS. 18-19), the NMOS transistors 51-2 and 52-2 are turned off when the word line WL2 is set to LOW, and any one of the NMOS transistors 51-1, 52-1, 51-2, and 52-2 are turned on when subjected to a recall operation, a reverse-program operation, or an erase operation.

Figure 14:
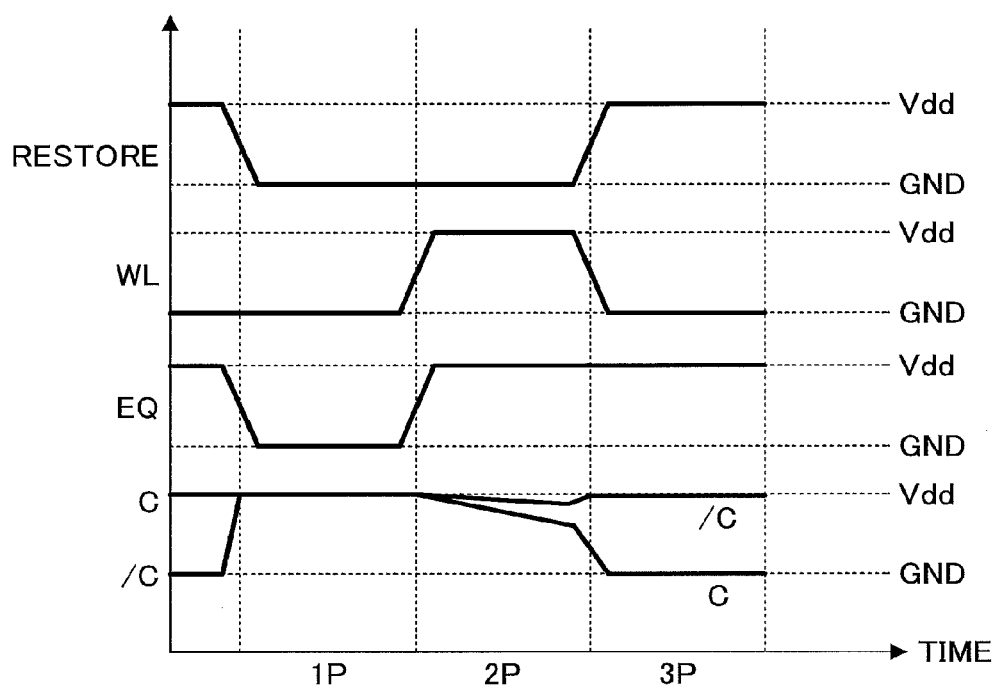
FIG. 14 is a signal waveform diagram illustrating an example of a recall operation.

FIG. 14 is a signal waveform diagram illustrating an example of the recall operation. When the mode input from outside the semiconductor memory device 40 indicates a recall operation, the control signals EQ, RESTORE, WL, STORE and RECALL are set to 0-1-1, 0-0-1, 0-1-0, 1 and 1, respectively, as shown in FIG. 11. Here, the notation "0-1-0", for example, indicates that the signal level is set to "0" at the first phase, "1" at the second phase, and "0" at the third phase. The first, second, and third phases are illustrated in FIG. 14 as 1P, 2P, and 3P, respectively. FIG. 14 illustrates the waveforms of the signals RESTORE, WL (i.e., selected word line), EQ, C and /C (i.e., the two nodes of the sense amplifier).

At the first phase 1P, the signal RESTORE is set to 0, and the signal EQ is set to 0. As a result, the NMOS transistor 62 in FIG. 10 becomes nonconductive to deactivate the sense amplifier, and the PMOS transistors 55 through 57 in FIG. 10 become conductive to equalize and set the two nodes of the sense amplifier to Vdd (i.e., normal high voltage). The equalization of the nodes C and /C is illustrated in FIG. 14 as occurring at the first phase 1P.

At the second phase 2P, the signal EQ is set to 1, and the word line WL is set to 1. As a result, the PMOS transistors 55 through 57 in FIG. 10 are turned off to separate the nodes C and /C from each other, and the NMOS transistors 51-$i$ and 52-$i$ of the activated word line WLi in FIG. 10 are turned on. Assuming that the program operation as illustrated in FIG. 12 has been performed prior to the recall operation, the NMOS transistor 52-$i$ situated on the /C-node side has a higher threshold voltage, and thus has a higher ON resistance. Accordingly, the force that pulls down the node /C toward the ground potential through the NMOS transistor 53 is weaker than the force that pulls down the node C, resulting in the nodes C and /C changing to LOW and HIGH, respectively, as shown at the second phase 2P in FIG. 14.

At the third phase, the signal RESTORE is set to 1, and the word line WL is set to 0. As a result, the NMOS transistor 62 in FIG. 10 becomes conductive to activate the sense amplifier, and the NMOS transistors 51-$i$ and 52-$i$ of the selected row are turned off. The activated sense amplifier amplifies a potential difference appearing between the node C and the node /C, thereby sensing (detecting) the data stored in the pair of the NMOS transistors 51-$i$ and 52-$i$. The amplification of the potential difference between the nodes C and /C is illustrated as occurring at the third phase 3P in FIG. 14.

It may be noted that the drain currents flow through the NMOS transistors 51-$i$ and 52-$i$ during the recall operation in a direction opposite to the direction in which drain currents flow through the NMOS transistors 51-$i$ and 52-$i$ during the program operation. Namely, the source/drain positions of the NMOS transistors 51-$i$ and 52-$i$ in the recall operation are swapped relative to those in the program operation. With this arrangement, the asymmetric nature of the hot-carrier effect is utilized to provide a sufficiently large difference in threshold voltages between the NMOS transistors 51-$i$ and 52-$i$.

Figure 15:
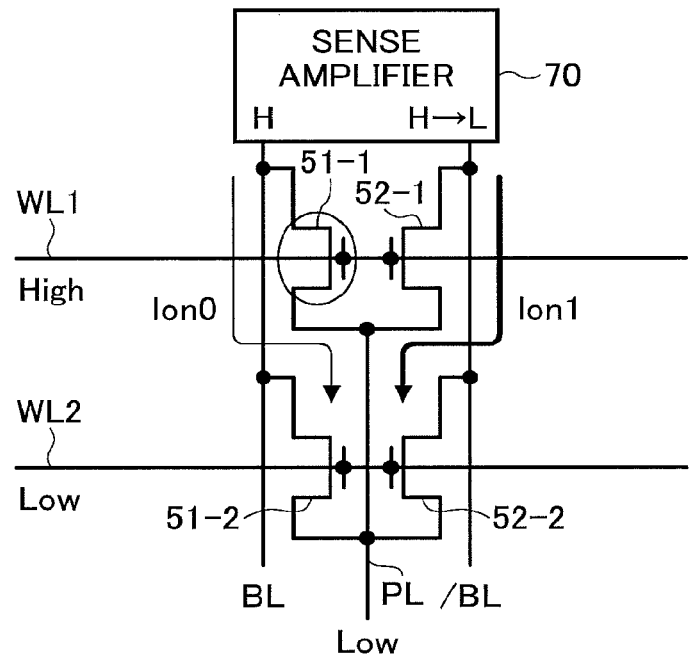
FIG. 15 is a drawing illustrating an example of the operation of a memory cell and a sense amplifier at the time of a recall operation.

FIG. 15 is a drawing illustrating an example of the operation of a memory cell and a sense amplifier at the time of a recall operation. The same elements as those of FIG. 13 are referred to by the same numerals.

In FIG. 15, the word line WL1 is selectively activated to HIGH, and the word line WL2 is set to LOW. This word-line setting selects the memory cell connected to the word line WL1 for the recall operation. In the example illustrated in FIG. 15, the NMOS transistor 51-1 indicated by an open oval mark has been programmed to have an increased threshold voltage as in the example illustrated in FIG. 13. The potential line PL is set to a low voltage (i.e., 0 V). With this arrangement, a drain current Ion0 flowing through the NMOS transistor 51-1 is smaller than a drain current Ion1 flowing through the NMOS transistor 52-1. The node of the sense amplifier 70 connected to the bit line /BL is changed to LOW while the other node of the sense amplifier 70 connected to the bit line BL remains at HIGH.

The data retrieved from the selected memory cell to the sense amplifier 70 may be supplied to outside the semiconductor memory device 40 through the output buffer 42 (see FIG. 8). It may be noted that the data state of the sense amplifier 70 as to which one of the two nodes thereof is HIGH is reversed at the time of a recall operation relative to the data state of the sense amplifier 70 used at the time of a program operation. This can be seen by comparing the two nodes of the sense amplifier 70 between FIG. 13 and FIG. 15. Such a reversal may be taken into consideration when the data is output to outside the semiconductor memory device 40.

Figure 16:
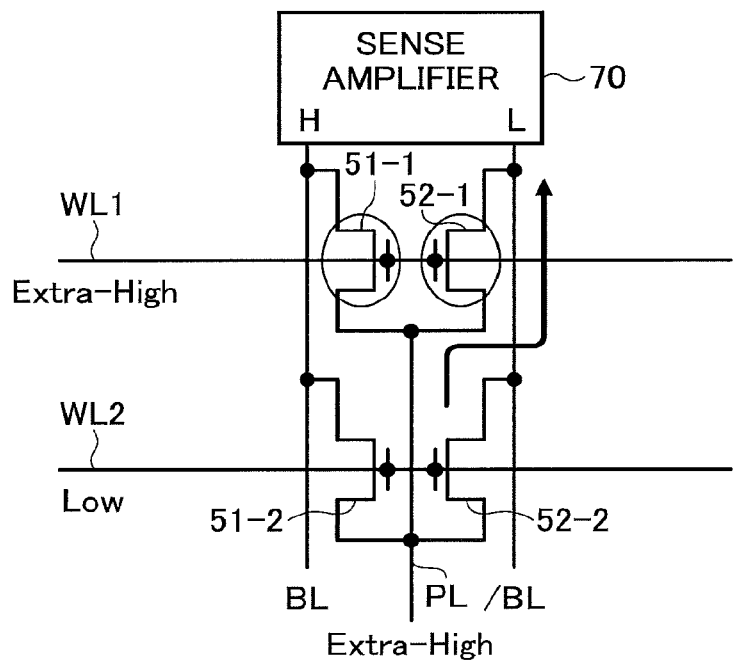
FIG. 16 is a drawing illustrating an example of the operation of a memory cell and a sense amplifier at the time of a reverse-program operation.

FIG. 16 is a drawing illustrating an example of the operation of a memory cell and a sense amplifier at the time of a reverse-program operation. The same elements as those of FIG. 13 are referred to by the same numerals.

The "REVERSE-PROGRAM" operation is the same as the normal program operation in terms of the voltage settings and behaviors of relevant signals. As was previously described, however, the "REVERSE-PROGRAM" operation is performed immediately after a recall operation that retrieves data from a selected memory cell. The example illustrated in FIG. 16 is directed to the case in which the recall operation illustrated in FIG. 15 was performed immediately prior to the program operation illustrated in FIG. 16. Namely, the sense amplifier 70 has data stored therein such that the two nodes thereof connected to the bit lines BL and /BL are HIGH and LOW, respectively. As a program operation is performed in this state, the NMOS transistor 52-1 that is the unprogrammed one of the two NMOS transistors 51-1 and 52-1 is programmed by this program operation. Both of the two NMOS transistor 51-1 and 52-1 are thus in the programmed state after this program operation as indicated by two open oval marks superimposed on these two NMOS transistors in FIG. 16.

The above-noted "REVERSE-PROGRAM" operation serves to provide a balance between the NMOS transistor 51-$i$ and the NMOS transistor 52-$i$ in the selected i-th row. If only one of the NMOS transistors 51-$i$ and 52-$i$ is programmed and erased, the voltage-current characteristics end up differing between these two NMOS transistors 51-$i$ and 52-$i$. Since the recall operation is performed by comparing the drain currents of these two NMOS transistors 51-$i$ and 52-$i$ with each other, such unbalanced voltage-current characteristics may result in an erroneous recall operation, which produces sensed (i.e., detected) data that is different from the true stored value.

In the semiconductor memory device 40 of the present embodiment, the reverse-program operation is always performed prior to an erase operation, followed by the erase operation that erases both of the two NMOS transistors of a given memory cell. This arrangement ensures that the two NMOS transistors have both undergone the equal number of program-&-erase cycles, and thus have substantially equal voltage-current characteristics at any given moment. Reliable recall operations are thus ensured.

Figure 17:
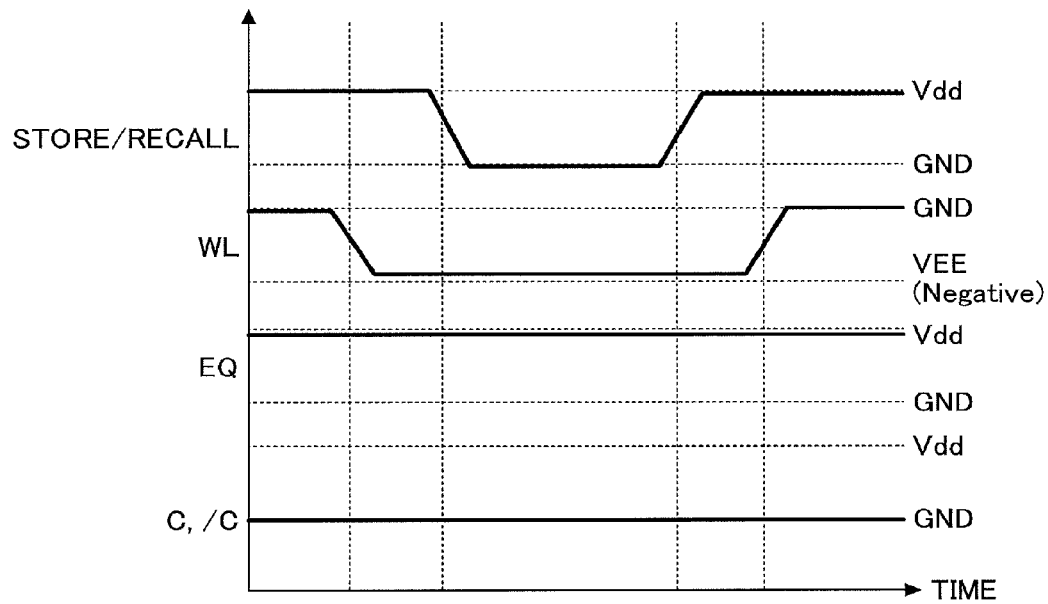
FIG. 17 is a signal waveform diagram illustrating an example of an erase operation.

FIG. 17 is a signal waveform diagram illustrating an example of the erase operation. When the mode input from outside the semiconductor memory device 40 indicates the erase operation, the control signals EQ, RESTORE, WL, STORE and RECALL are set to 1, 1, −1 (i.e. negative voltage VEE), 0 and 0, respectively, as shown in FIG. 11. FIG. 17 illustrates the waveforms of the signals STORE, RECALL, WL (i.e., selected word line), EQ, C and /C (i.e., the two nodes of the sense amplifier). A selected word line WLi in FIG. 10 (shown as WL in FIG. 17) is set to the negative voltage VEE. In response to STORE being 0 (i.e., LOW), the PMOS transistor 54 in FIG. 10 is placed in the conductive state, so that the extra-high voltage VPP is applied to the drain nodes of the NMOS transistors 51-*i* and 52-*i* connected to the activated word line WLi. As is illustrated in FIG. 17, the nodes C and /C of the sense amplifier are both LOW (i.e., at the ground voltage) because the control signal ERASE is set to 1 as shown in FIG. 11. Accordingly, both of the NMOS transistors 51-*i* and 52-*i* are erased by the erase operation.

Figure 18:
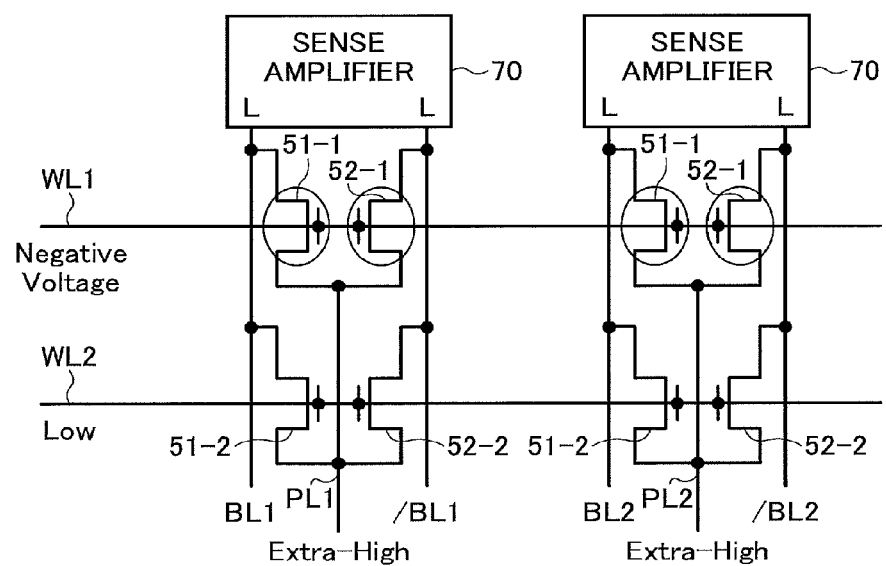
FIG. 18 is a drawing illustrating an example of the operation of a memory cell and a sense amplifier at the time of an erase operation.

FIG. 18 is a drawing illustrating an example of the operation of a memory cell and a sense amplifier at the time of an erase operation. In FIG. 18, both of the potential lines PL1 and PL2 are set to the extra-high voltage, and only the word line WL1 is set to the negative voltage. With this arrangement, all the NMOS transistors 51-1 and 52-1 connected to the word line WL1 are subjected to the erase operation. These NMOS transistors subjected to the erase operation are indicated by open oval marks superimposed thereon.

Figure 19:
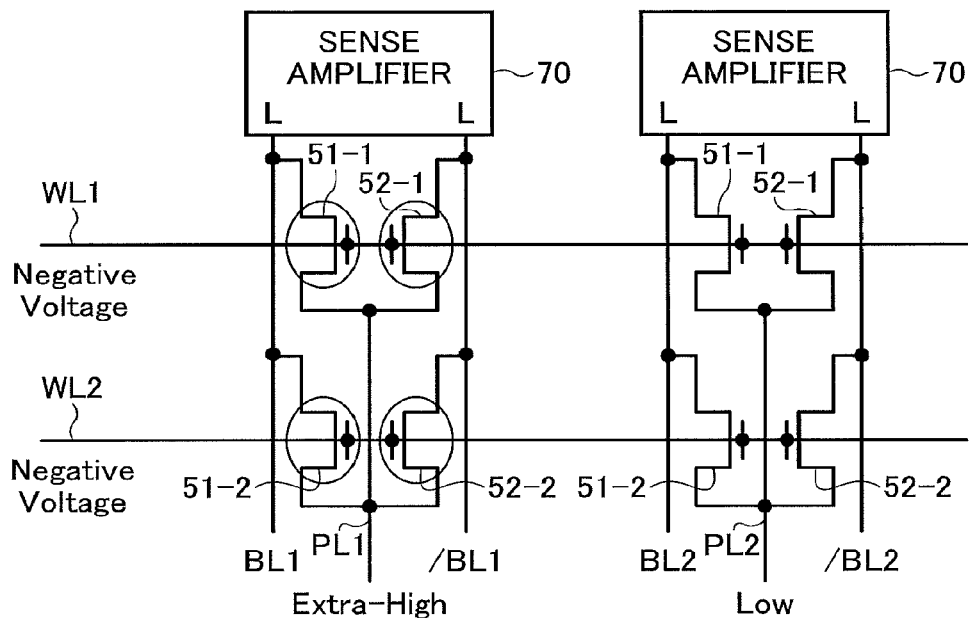
FIG. 19 is a drawing illustrating another example of the operation of a memory cell and a sense amplifier at the time of an erase operation.

FIG. 19 is a drawing illustrating another example of the operation of a memory cell and a sense amplifier at the time of an erase operation. In FIG. 19, only the potential line PL1 is set to the extra-high voltage, and both of the word lines WL1 and WL2 are set to the negative voltage. With this arrangement, all the NMOS transistors of the memory cells connected to the potential line PL1 are subjected to the erase operation. These NMOS transistors subjected to the erase operation are indicated by open oval marks superimposed thereon.

Figure 20:
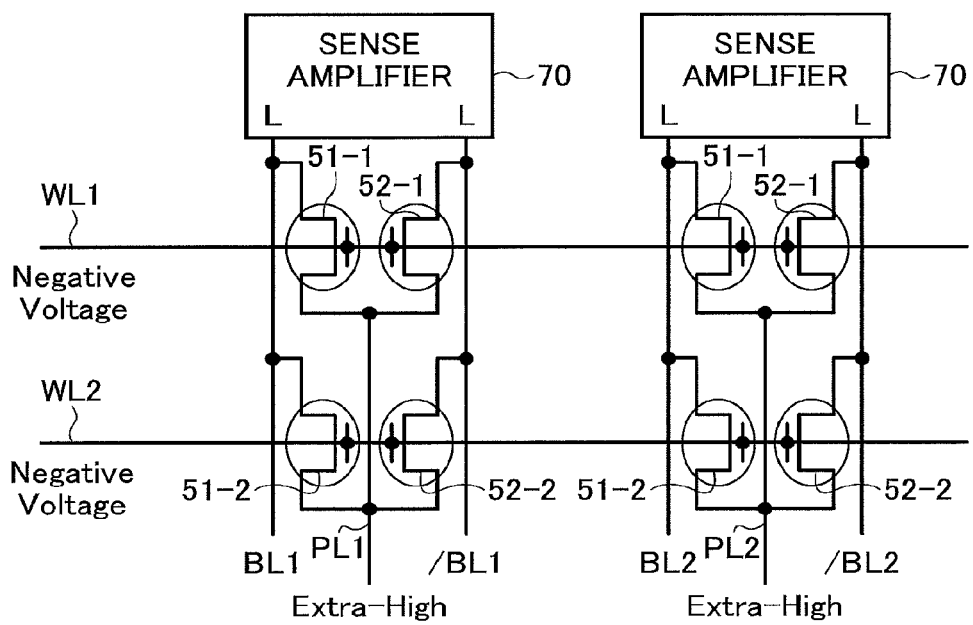
FIG. 20 is a drawing illustrating yet another example of the operation of a memory cell and a sense amplifier at the time of an erase operation.

FIG. 20 is a drawing illustrating yet another example of the operation of a memory cell and a sense amplifier at the time of an erase operation. In FIG. 20, both of the potential lines PL1 and PL2 are set to the extra-high voltage, and both of the word lines WL1 and WL2 are set to the negative voltage. With this arrangement, the NMOS transistors of all the memory cells in the memory cell array (comprised of two rows and two columns) are subjected to the erase operation. These NMOS transistors subjected to the erase operation are indicated by open oval marks superimposed thereon.

A program operation may be performed in response to a program command that is issued to the semiconductor memory device 40 as mode input signals applied to the mode selector & state machine 46. A recall operation may be performed in response to a recall command that is issued to the semiconductor memory device 40 as mode input signals applied to the mode selector & state machine 46. A reverse-program operation may be performed in response to a reverse-program command that is issued to the semiconductor memory device 40 as mode input signals applied to the mode selector & state machine 46. An erase operation may be performed in response to a recall command that is issued to the semiconductor memory device 40 as mode input signals applied to the mode selector & state machine 46. Each of the operations noted above may be performed with respect to a row address and one or more column addresses that are specified by row and column address signals applied to the semiconductor memory device 40. Alternatively, some or the operations may be performed with respect to a specified row address and all the column addresses, with respect to all the row addresses and a specified column address, or with respect to all the row addresses and all the column addresses.

The user may exercise caution to perform a reverse-program operation before an erase operation so as to ensure that the two NMOS transistors of a memory cell of interest are both programmed before any erase operation with respect to this memory cell. Alternatively, the semiconductor memory device 40 may be provided some mechanism to perform a reverse-program operation before an erase operation so as to ensure that the two NMOS transistors of a memory cell of interest are both programmed before any erase operation with respect to this memory cell. For example, an erase command issued to the semiconductor memory device 40 may cause the mode selector & state machine 46 to perform a reverse-program operation and a subsequent erase operation as one set of inseparable operations with respect to a memory cell of interest that may be specified by a row address and a column address.

Figure 21:
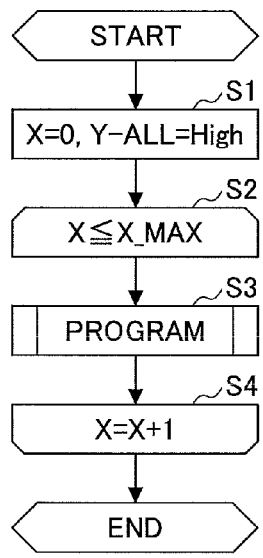
FIG. 21 is a flowchart illustrating an example of program operations.

FIG. 21 is a flowchart illustrating an example of program operations. In this example, program operations are performed one by one on a word-line-by-word-line basis with respect to every row and performed with respect to all the columns on a single row at once. A program command may be issued to the semiconductor memory device 40 (see FIG. 8) as mode input signals into the mode selector & state machine 46, thereby causing the mode selector & state machine 46 to perform the program operations illustrated in FIG. 21.

In step S1, a row address (i.e., X) is set to 0, and a setting is made (i.e., Y–ALL=HIGH) to indicate that all the column addresses are simultaneously subjected to each one of the program operations. In step S2, an operation loop continues as long as the row address is smaller than or equal to the maximum row address (i.e., X_MAX). In step S3, a program operation is performed with respect to the current row address and with respect to all the column addresses. In step S4, the row address is incremented by one, and the procedure returns to step S2 according to the operation loop. When the current row address exceeds the maximum row address, the operation loop comes to an end.

Figure 22:
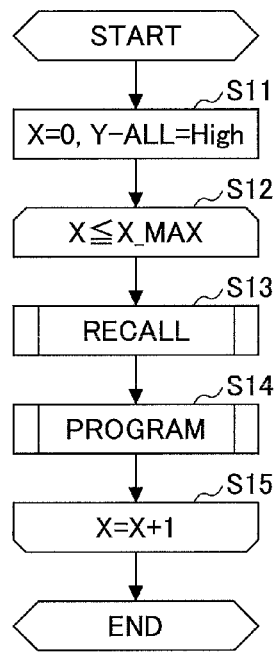
FIG. 22 is a flowchart illustrating an example of reverse-program operations.

FIG. 22 is a flowchart illustrating an example of reverse-program operations. In this example, reverse-program operations are performed one by one on a word-line-by-word-line basis with respect to every row and performed with respect to all the columns on a single row at once. A reverse-program command may be issued to the semiconductor memory device 40 (see FIG. 8) as mode input signals into the mode selector & state machine 46, thereby causing the mode selector & state machine 46 to perform the reverse-program operations illustrated in FIG. 21.

In step S11, a row address (i.e., X) is set to 0, and a setting is made (i.e., Y–ALL=HIGH) to indicate that all the column addresses are simultaneously subjected to each one of the program operations. In step S12, an operation loop continues as long as the row address is smaller than or equal to the maximum row address (i.e., X_MAX). In step S13, a recall operation is performed with respect to the current row address and with respect to all the column addresses. In step S14, a program operation is performed with respect to the current row address and with respect to all the column addresses. In step S15, the row address is incremented by one, and the procedure returns to step S12 according to the operation loop. When the current row address exceeds the maximum row address, the operation loop comes to an end.

Figure 23:
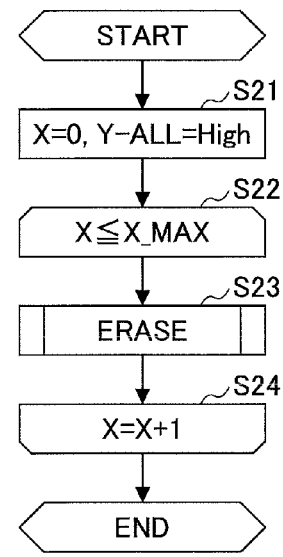
FIG. 23 is a flowchart illustrating an example of erase operations.

FIG. 23 is a flowchart illustrating an example of erase operations. In this example, erase operations are performed one by one on a word-line-by-word-line basis with respect to every row and performed with respect to all the columns on a single row at once. An erase command may be issued to the semiconductor memory device 40 (see FIG. 8) as mode input signals into the mode selector & state machine 46, thereby causing the mode selector & state machine 46 to perform the erase operations illustrated in FIG. 23.

In step S21, a row address (i.e., X) is set to 0, and a setting is made (i.e., Y_ALL=HIGH) to indicate that all the column addresses are simultaneously subjected to each one of the erase operations. In step S22, an operation loop continues as long as the row address is smaller than or equal to the maximum row address (i.e., X_MAX). In step S23, an erase operation is performed with respect to the current row address and with respect to all the column addresses. In step S24, the row address is incremented by one, and the procedure returns to step S22 according to the operation loop. When the current row address exceeds the maximum row address, the operation loop comes to an end.

Figure 24:
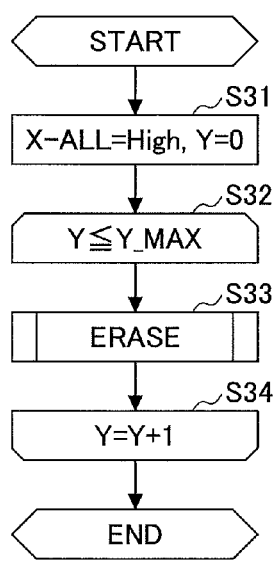
FIG. 24 is a flowchart illustrating another example of erase operations.

FIG. 24 is a flowchart illustrating another example of erase operations. In this example, erase operations are performed one by one on a column-by-column basis with respect to every column and performed with respect to all the rows on a single column at once. An erase command may be issued to the semiconductor memory device 40 (see FIG. 8) as mode input signals into the mode selector & state machine 46, thereby causing the mode selector & state machine 46 to perform the erase operations illustrated in FIG. 24.

In step S31, a column address (i.e., Y) is set to 0, and a setting is made (i.e., X_ALL=HIGH) to indicate that all the row addresses are simultaneously subjected to each one of the erase operations. In step S32, an operation loop continues as long as the column address is smaller than or equal to the maximum column address (i.e., Y_MAX). In step S33, an erase operation is performed with respect to the current column address and with respect to all the row addresses. In step S34, the column address is incremented by one, and the procedure returns to step S32 according to the operation loop. When the current column address exceeds the maximum column address, the operation loop comes to an end.

Figure 25:
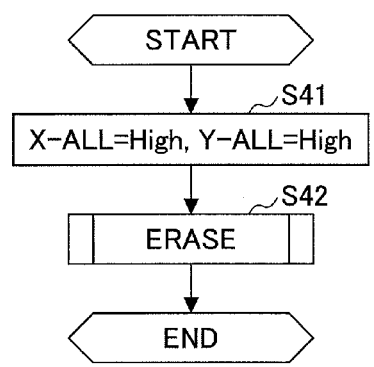
FIG. 25 is a flowchart illustrating another example of erase operations.

FIG. 25 is a flowchart illustrating another example of erase operations. In this example, an erase operation is performed with respect to all the rows and all the columns at once. An erase command may be issued to the semiconductor memory device 40 (see FIG. 8) as mode input signals into the mode selector & state machine 46, thereby causing the mode selector & state machine 46 to perform the erase operation illustrated in FIG. 25.

In step S41, settings are made (i.e., X_ALL=HIGH, Y_ALL=HIGH) to indicate that all the row addresses and all the column addresses are simultaneously subjected to the erase operation. In step S42, an erase operation is performed with respect to all the row addresses and all the column addresses at once. The procedure then comes to an end.

Figure 26:
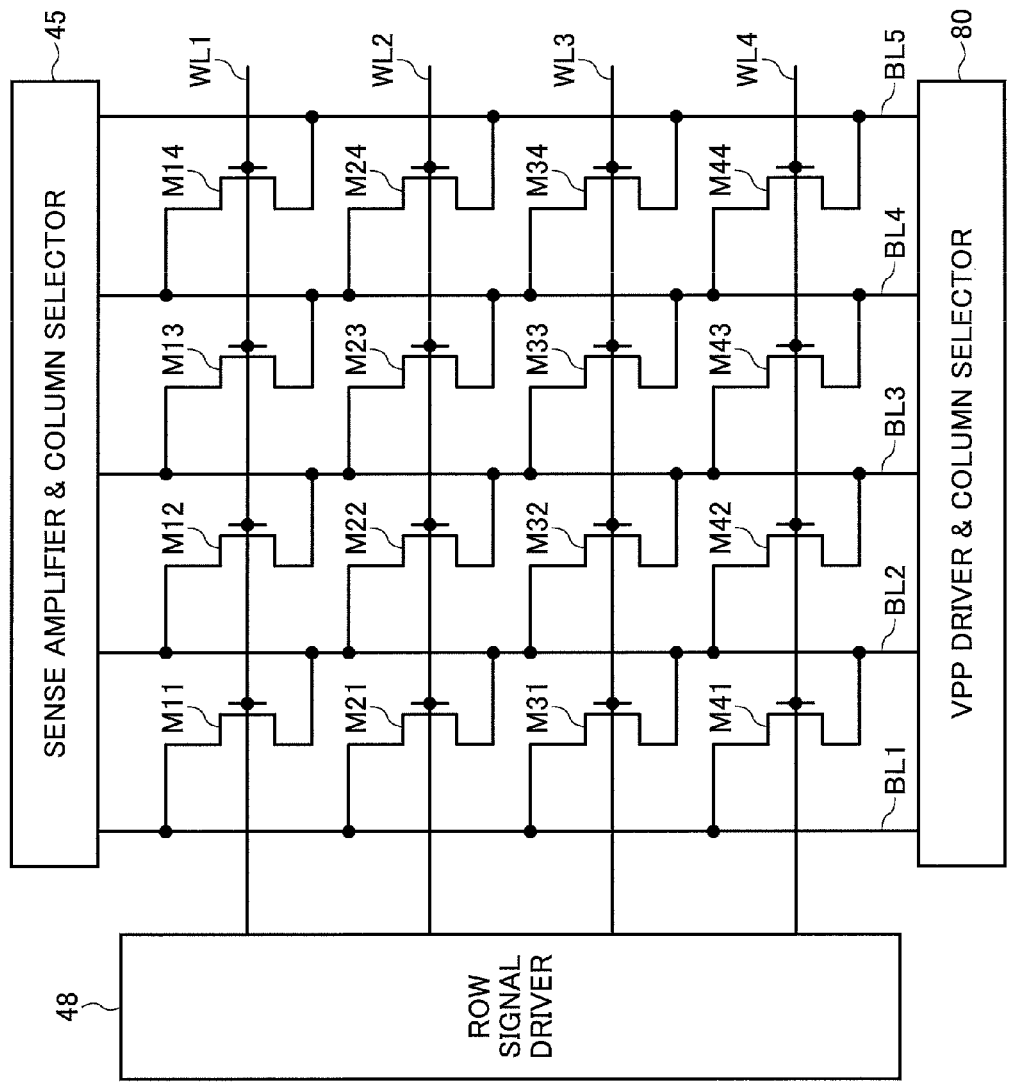
FIG. 26 is a drawing illustrating another example of the configuration of the memory cell array.

FIG. 26 is a drawing illustrating another example of the configuration of the memory cell array 49. In this example, the memory cell array 49 includes NMOS transistors M11 through M14, M21 through M24, M31 through M34 and M41 through M44, word lines WL1 through WL4, bit lines BL1 through BL5. Further, a VPP driver & column selector 80 is provided. The numbers of NMOS transistors, word lines and bit lines are examples only, and may be any different numbers.

The row signal driver 48 selectively activates one of the word lines WL1 through WL4. The row signal driver 48 sets the selected word line to the high voltage (e.g., 3.3 V) in the case of a recall operation, to the extra high voltage (e.g., 5 V) in the case of a program operation, and to the negative voltage (e.g., -5 V) in the case of an erase operation. The VPP driver & column selector 80 controls the voltage levels of the bit lines BL1 through BL5 similarly to the manner in which the row signal driver 48 controls the voltage levels of bit lines by use of the NMOS transistors 53 and the PMOS transistors 54 in the configuration illustrated in FIG. 10.

The bit lines BL1 through BL5 are connected to the sense amplifier & column selector 45. The sense amplifier & column selector 45 is configured to connect two of the bit lines BL1 through BL5 to the two nodes of a sense amplifier, respectively. These two bit lines are a given bit line (e.g., N-th line) and a second next bit line (e.g., N+2-th line). Namely, these two bit lines are the first and third bit lines in a given set of three consecutive bit lines.

Figure 27:
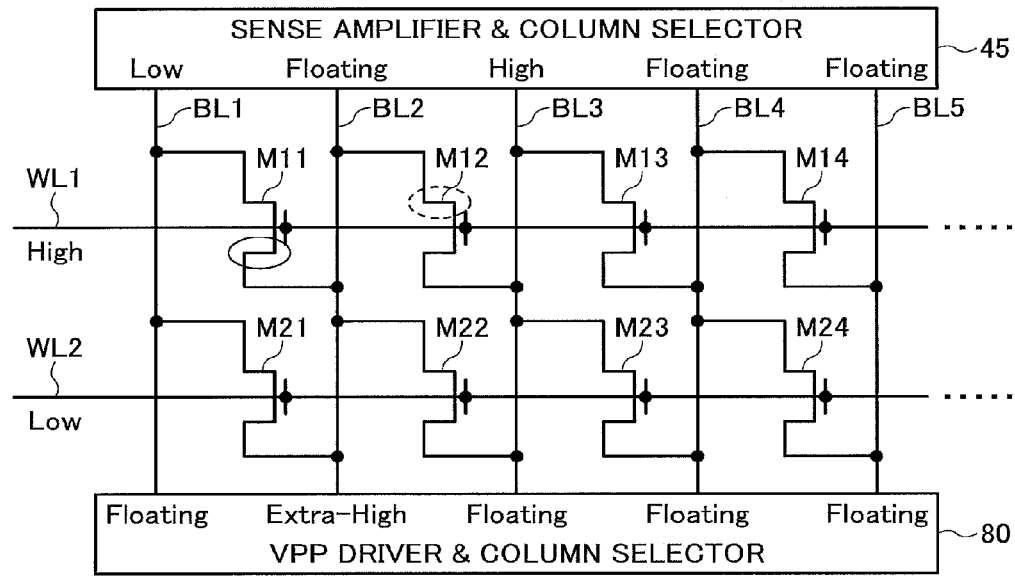
FIG. 27 is a drawing illustrating an example of a program operation performed with respect to the memory cell array illustrated in FIG. 26.

FIG. 27 is a drawing illustrating an example of a program operation performed with respect to the memory cell array illustrated in FIG. 26. For the sake of convenience of illustration, FIG. 27 illustrates only a portion of the memory cell array illustrated in FIG. 26, i.e., the NMOS transistors M11 through M14 and M21 through M24, the word lines WL1 and WL2, and the bit lines BL1 through BL5. It may be noted that in FIG. 27 and subsequent similar drawings (i.e., FIGS. 28 to 32), the word line WL1 is set to HIGH (or extra high voltage), and the word line WL2 is set to LOW.

In FIG. 27, the sense amplifier & column selector 45 couples the bit lines BL1 and BL3 to the two nodes of a sense amplifier thereof, and do not couple the remaining bit lines to any sense amplifiers. Further, the VPP driver & column selector 80 couples the bit line BL2 to the extra high voltage (e.g., 5 V), and do not couple the remaining bit lines to any potential nodes. The bit lines BL4 and BL5 are thus kept in a floating state. In the example illustrated in FIG. 27, the sense amplifier to which the bit lines BL1 and BL3 are coupled have data stored therein such that the bit line BL1 is set to LOW and the bit line BL3 is set to HIGH.

With this arrangement, the row signal driver 48 selectively sets the word line WL1 to HIGH (or extra high voltage). As a result, the NMOS transistor M11 is programmed so as to have electrons trapped on a sidewall thereof on the drain side. The programmed drain side of this NMOS transistor M11 is marked by a solid-line open oval superimposed thereon. The NMOS transistor M12 is not programmed, so that no electron is trapped a sidewall thereof on the drain side. The unprogrammed drain side of this NMOS transistor M12 is marked by a dotted-line open oval superimposed thereon.

Figure 28:
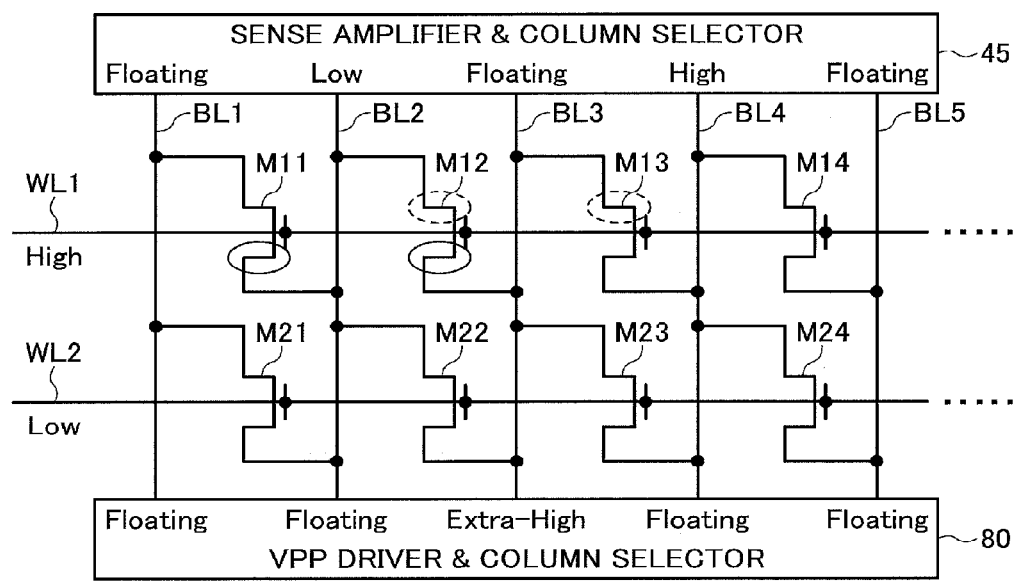
FIG. 28 is a drawing illustrating an example of a program operation performed with respect to the memory cell array illustrated in FIG. 26.

FIG. 28 is a drawing illustrating an example of a program operation performed with respect to the memory cell array illustrated in FIG. 26. In FIG. 28, the sense amplifier & column selector 45 couples the bit lines BL2 and BL4 to the two nodes of a sense amplifier thereof, and do not couple the remaining bit lines to any sense amplifiers. Further, the VPP driver & column selector 80 couples the bit line BL3 to the extra high voltage (e.g., 5 V), and do not couple the remaining bit lines to any potential nodes. The bit lines BL1 and BL5 are thus kept in a floating state. In the example illustrated in FIG. 28, the sense amplifier to which the bit lines BL2 and BL4 are coupled have data stored therein such that the bit line BL2 is set to LOW and the bit line BL4 is set to HIGH.

With this arrangement, the row signal driver 48 selectively sets the word line WL1 to HIGH (or extra high voltage). As a result, the NMOS transistor M12 is programmed so as to have electrons trapped on a sidewall thereof on the drain side. The programmed drain side of this NMOS transistor M12 is marked by a solid-line open oval superimposed thereon. The NMOS transistor M13 is not programmed, so that no electron is trapped a sidewall thereof on the drain side. The unprogrammed drain side of this NMOS transistor M13 is marked by a dotted-line open oval superimposed thereon.

Figure 29:
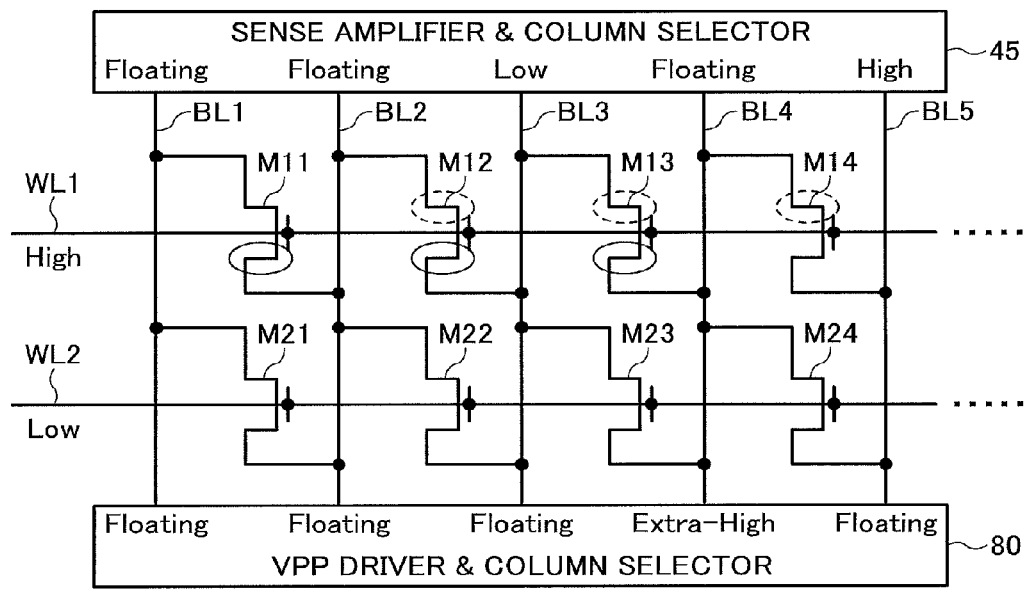
FIG. 29 is a drawing illustrating an example of a program operation performed with respect to the memory cell array illustrated in FIG. 26.

FIG. 29 is a drawing illustrating an example of a program operation performed with respect to the memory cell array illustrated in FIG. 26. Similarly to the manner in which NMOS transistors are programmed in FIG. 27 and FIG. 28, the NMOS transistor M13 is programmed in FIG. 29 so as to have electrons trapped on a sidewall thereof on the drain side. The programmed drain side of this NMOS transistor M13 is marked by a solid-line open oval superimposed thereon. The NMOS transistor M14 is not programmed, so that no electron is trapped a sidewall thereof on the drain side. The unprogrammed drain side of this NMOS transistor M14 is marked by a dotted-line open oval superimposed thereon.

Figure 30:
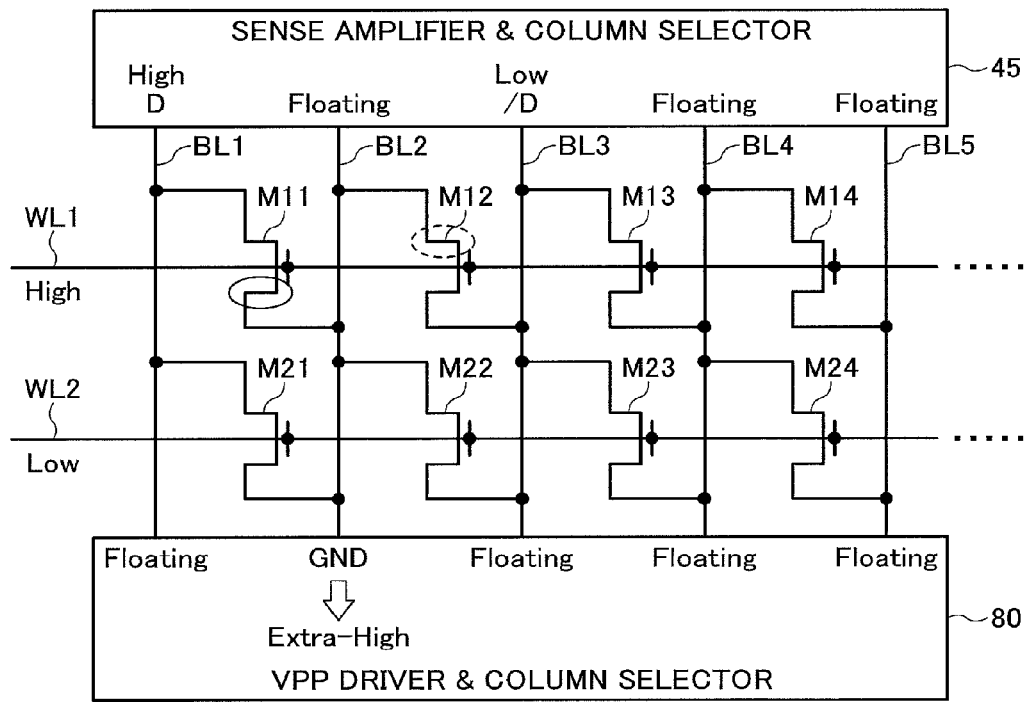
FIG. 30 is a drawing illustrating an example of recall and reverse-program operations performed with respect to the memory cell array illustrated in FIG. 26.

FIG. 30 is a drawing illustrating an example of recall and reverse-program operations performed with respect to the memory cell array illustrated in FIG. 26. In FIG. 30, the sense amplifier & column selector 45 couples the bit lines BL1 and BL3 to the two nodes D and /D of a sense amplifier thereof, and do not couple the remaining bit lines to any sense amplifiers. Further, the VPP driver & column selector 80 initially couples the bit line BL2 to the ground voltage (e.g., 0 V), and do not couple the remaining bit lines to any potential nodes. The bit lines BL4 and BL5 are thus kept in a floating state.

The drain side that has previously been programmed is marked by a solid-line open oval superimposed thereon. The drain side that is not programmed is marked by a dotted-line open oval superimposed thereon. With this arrangement, the row signal driver 48 selectively sets the word line WL1 to HIGH. A larger drain current flows through the NMOS transistor M12 than the drain current flowing through the NMOS transistor M11. As a result, the sense amplifier node D is set to HIGH, and the sense amplifier node /D is set to LOW. It may be noted that, in this recall operation, the two adjacent NMOS transistors (e.g., M11 and M12) are used as a transistor pair for which the threshold voltages are compared with each other.

Subsequently, the VPP driver & column selector 80 changes the coupling of the bit line BL2 from the ground voltage (e.g., 0 V) to the extra-high voltage (e.g., 5 V) to perform a reverse-program operation. In the example illustrated in FIG. 30, the NMOS transistor M12 that is the unprogrammed one of the two NMOS transistors M11 and M12 is programmed by this reverse-program operation so as to have electrons trapped on a sidewall thereof on the drain side. Namely, the drain side of the NMOS transistor M12, which is marked by the dotted-line open oval superimposed thereon, is programmed to have electrons trapped on the sidewall on the drain side.

Figure 31:
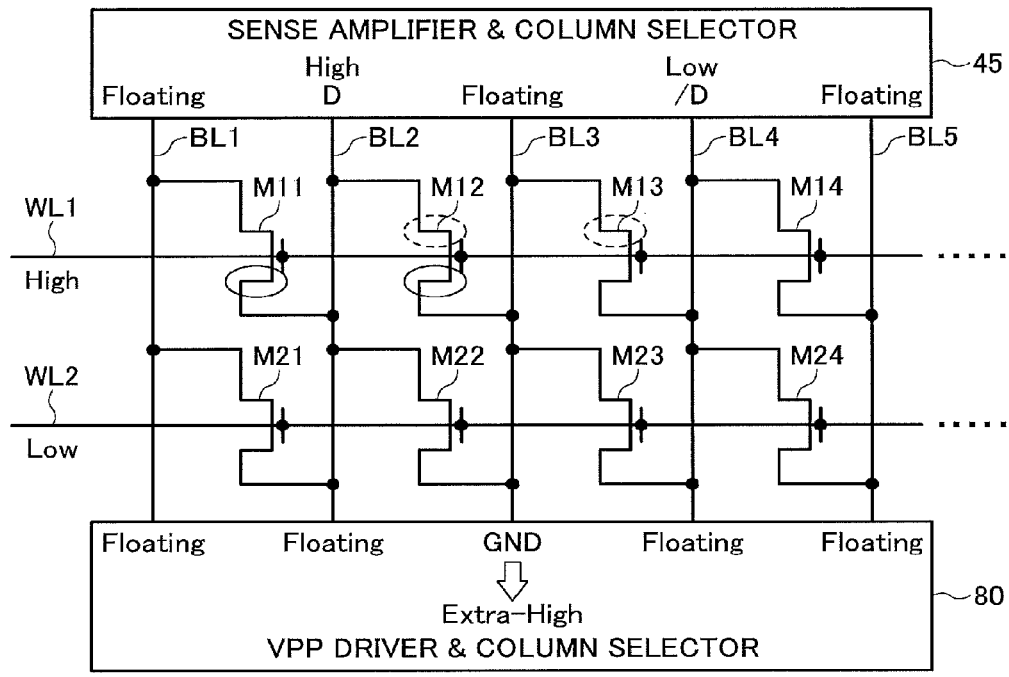
FIG. 31 is a drawing illustrating an example of recall and reverse-program operations performed with respect to the memory cell array illustrated in FIG. 26.

FIG. 31 is a drawing illustrating an example of recall and reverse-program operations performed with respect to the memory cell array illustrated in FIG. 26. In FIG. 31, the sense amplifier & column selector 45 couples the bit lines BL2 and BL4 to the two nodes D and /D of a sense amplifier thereof, and do not couple the remaining bit lines to any sense amplifiers. Further, the VPP driver & column selector 80 initially couples the bit line BL3 to the ground voltage (e.g., 0 V), and do not couple the remaining bit lines to any potential nodes. The bit lines BL1 and BL5 are thus kept in a floating state.

The drain sides that have previously been programmed are marked by solid-line open ovals superimposed thereon. The drain sides that are not programmed are marked by dotted-line open ovals superimposed thereon. With this arrangement, the row signal driver 48 selectively sets the word line WL1 to HIGH. A larger drain current flows through the NMOS transistor M13 than the drain current flowing through the NMOS transistor M12. As a result, the sense amplifier node D is set to HIGH, and the sense amplifier node /D is set to LOW. It may be noted that, in this recall operation, the fact of whether or not the drain side of the NMOS transistor M13 (i.e., the side toward the sense amplifier) is in the programmed state does not affect the amount of drain current flowing through the NMOS transistor M13 in a practical manner. This is because of the asymmetric nature of the hot carrier effect as was previously described.

Subsequently, the VPP driver & column selector 80 changes the coupling of the bit line BL3 from the ground voltage (e.g., 0 V) to the extra-high voltage (e.g., 5 V) to perform a reverse-program operation. In the example illustrated in FIG. 31, the NMOS transistor M13 that is the unprogrammed one of the two NMOS transistors M12 and M13 is programmed by this reverse-program operation so as to have electrons trapped on a sidewall thereof on the drain side. Namely, the drain side of the NMOS transistor M12 at the time of a program operation, which is marked by a dotted-line open oval superimposed thereon, is programmed to have electrons trapped on the sidewall on the drain side.

Figure 32:
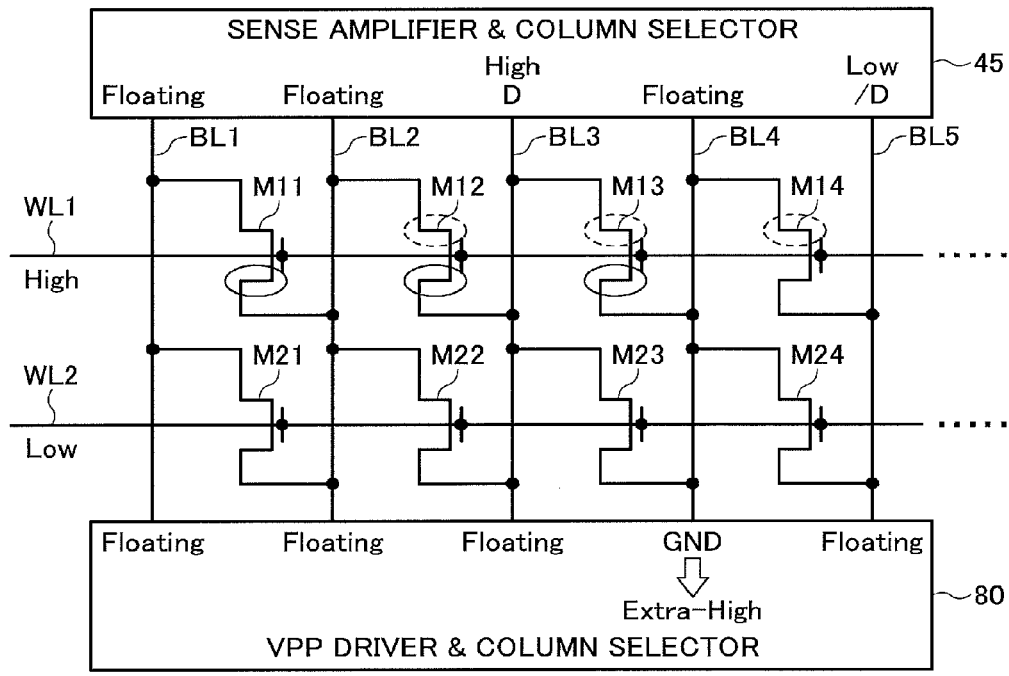
FIG. 32 is a drawing illustrating an example of recall and reverse-program operations performed with respect to the memory cell array illustrated in FIG. 26.

FIG. 32 is a drawing illustrating an example of recall and reverse-program operations performed with respect to the memory cell array illustrated in FIG. 26. Similarly to the manner in which the recall and reverse-program operations are performed in FIG. 29 and FIG. 31, recall and reverse-program operations are performed with respect to the two NMOS transistors M13 and M14, which form a transistor pair to serve as a single memory cell that stores a single data bit.

Further, the present invention is not limited to these embodiments, but various variations and modifications may be made without departing from the scope of the present invention.

What is claimed is:

1. A nonvolatile memory device, comprising:
a pair of MIS transistors one of which is placed in a programmed state by a first program operation utilizing a hot carrier effect to store one-bit data in the pair of MIS transistors; and
a control unit configured to recall the one-bit data from the pair of MIS transistors in a recall operation, to cause an unprogrammed one of the MIS transistors to be placed in a programmed state by a second program operation utilizing a hot carrier effect in response to the one-bit data recalled from the pair of MIS transistors, and to erase the programmed state of both of the MIS transistors in an erase operation.

2. The nonvolatile memory device as claimed in claim 1, wherein the one-bit data recalled from the pair of MIS transistors is utilized to select the unprogrammed one of the MIS transistors.

3. The nonvolatile memory device as claimed in claim 1, further comprising a sense amplifier configured to have two nodes thereof set to different signal levels upon being activated,
wherein first source/drain nodes of the MIS transistors are electrically connected to the two nodes of the sense amplifiers, respectively, so that the two nodes are set to different signal levels responsive to the one-bit data recalled from the pair of MIS transistors in the recall operation, and
wherein second source/drain nodes of the MIS transistors are electrically connected to a potential for causing a hot carrier effect in the second program operation while the first source/drain nodes of the MIS transistors are electrically connected to the two nodes of the sense amplifiers, a direction of currents flowing through the MIS transistors in the recall operation being opposite to a direction of currents flowing through the MIS transistors in the first and second program operations.

4. The nonvolatile memory device as claimed in claim 1, wherein the control unit is configured to apply a positive voltage to gate nodes of the MIS transistors in the first program operation and in the second program operation, and to apply a negative voltage to the gate nodes of the MIS transistors in the erase operation.

5. The nonvolatile memory device as claimed in claim 1, wherein the control unit is configured to perform the first and second program operations by injecting hot carriers of a first type to at least a sidewall of one of the MIS transistors, and to perform the erase operation by injecting hot carriers of a second type to at least a sidewall of one of the MIS transistors.

6. The nonvolatile memory device as claimed in claim 1, wherein the programmed state of a first one of the MIS transistors is erased together with the programmed state of a second one of the MIS transistors.

7. The nonvolatile memory device as claimed in claim 1, wherein one of the MIS transistors is in the programmed state to store one-bit data in the pair of MIS transistors, and both of the MIS transistors are placed in the programmed state for the erase operation to be performed.

8. A method of controlling a nonvolatile memory device, comprising:
  placing one of a pair of MIS transistors in a programmed state through a first program operation utilizing a hot carrier effect to store one-bit data in the pair of MIS transistors;
  recalling the one-bit data from the pair of MIS transistors in a recall operation;
  placing an unprogrammed one of the MIS transistors in a programmed state through a second program operation utilizing a hot carrier effect in response to the one-bit data recalled from the pair of MIS transistors; and
  erasing the programmed state of both of the MIS transistors in an erase operation.

9. The method of controlling a nonvolatile memory device as claimed in claim 8, further comprising utilizing the one-bit data recalled from the pair of MIS transistors to select the unprogrammed one of the MIS transistors.

10. The method of controlling a nonvolatile memory device as claimed in claim 8, wherein the step of recalling includes coupling first source/drain nodes of the MIS transistors to a sense amplifier to cause the sense amplifier to store the one-bit data, and the step of placing includes coupling second source/drain nodes of the MIS transistors to a potential for causing a hot carrier effect while the first source/drain nodes of the MIS transistors are coupled to the sense amplifier, a direction of currents flowing through the MIS transistors in the recall operation being opposite to a direction of currents flowing through the MIS transistors in the first and second program operations.

11. The method of controlling a nonvolatile memory device as claimed in claim 8, wherein a positive voltage is applied to gate nodes of the MIS transistors in the first program operation and in the second program operation, and a negative voltage is applied to the gate nodes of the MIS transistors in the erase operation.

* * * * *